(12) United States Patent
Ikeda

(10) Patent No.: US 12,471,270 B2
(45) Date of Patent: Nov. 11, 2025

(54) DYNAMIC RANDOM ACCESS MEMORY AND METHOD OF FABRICATING THE SAME

(71) Applicant: Winbond Electronics Corp., Taichung (TW)

(72) Inventor: Noriaki Ikeda, Kaohsiung (TW)

(73) Assignee: Winbond Electronics Corp., Taichung (TW)

( * ) Notice: Subject to any disclaimer, the term of this patent is extended or adjusted under 35 U.S.C. 154(b) by 480 days.

(21) Appl. No.: 18/167,900

(22) Filed: Feb. 13, 2023

(65) Prior Publication Data

US 2024/0276702 A1    Aug. 15, 2024

(51) Int. Cl.
H10B 12/00 (2023.01)

(52) U.S. Cl.
CPC ....... H10B 12/315 (2023.02); H10B 12/0335 (2023.02); H10B 12/34 (2023.02); H10B 12/482 (2023.02)

(58) Field of Classification Search
CPC ..... H10B 12/315; H10B 12/482; H10B 12/34
See application file for complete search history.

(56) References Cited

U.S. PATENT DOCUMENTS

| | | | |
|---|---|---|---|
| 9,099,302 B2 | 8/2015 | Lee | |
| 2015/0061134 A1* | 3/2015 | Lee | H01L 21/76895 257/751 |
| 2015/0262625 A1* | 9/2015 | Han | H10B 12/482 257/773 |
| 2016/0181143 A1* | 6/2016 | Kwon | H10B 12/34 438/586 |
| 2018/0301459 A1* | 10/2018 | Kim | H10B 12/482 |
| 2019/0019795 A1 | 1/2019 | Takesako et al. | |
| 2019/0088739 A1* | 3/2019 | Lee | H10B 12/482 |
| 2019/0221570 A1 | 7/2019 | Liu et al. | |
| 2021/0408004 A1 | 12/2021 | Lee et al. | |

FOREIGN PATENT DOCUMENTS

| | | |
|---|---|---|
| TW | 202038386 | 10/2020 |
| TW | 202201653 | 1/2022 |
| TW | 202209635 | 3/2022 |
| TW | 202303929 | 1/2023 |

OTHER PUBLICATIONS

"Office Action of Taiwan Counterpart Application", issued on Jan. 7, 2025, p. 1-p. 8.

* cited by examiner

*Primary Examiner* — Steven M Page
(74) *Attorney, Agent, or Firm* — JCIPRNET

(57) ABSTRACT

Provided is a DRAM including includes bit line stack patterns on a substrate, spacers on sidewalls of the bit line stack patterns, capacitor contacts electrically connected to active regions in the substrate, and capacitor landing pads covering the capacitor contacts, first portions of the spacers, and a portion of the bit line stack patterns. In each spacer, a second dielectric layer is located between a lower portion of a first dielectric layer and a lower portion of a third dielectric layer, and a fourth dielectric layer is located between an upper portion of the first dielectric layer and an upper portion of the third dielectric layer. Top surfaces of second portions of the plurality of spacers not covered by the plurality of capacitor landing pads are lower than top surfaces of the first portions of the plurality of spacers.

20 Claims, 30 Drawing Sheets

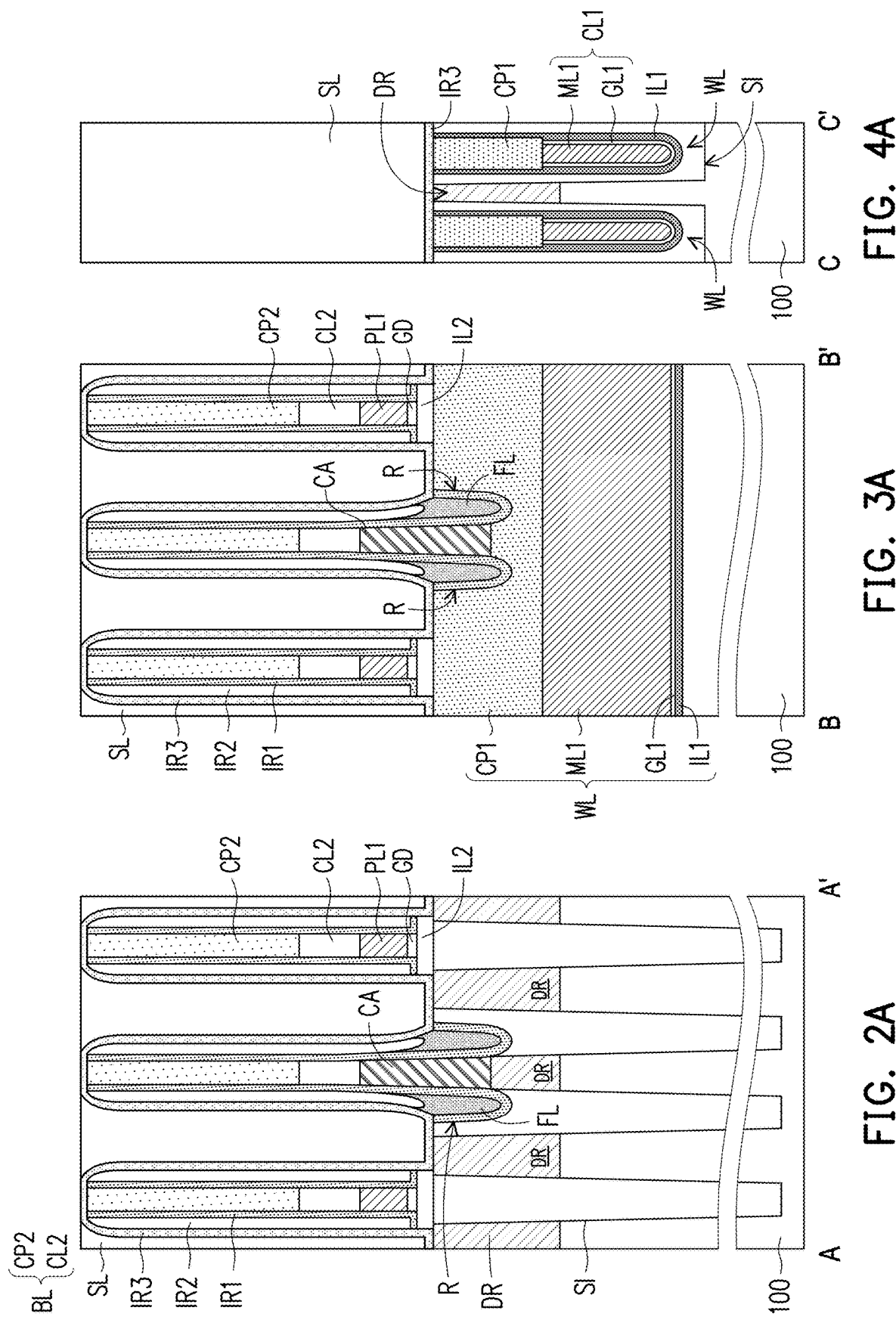

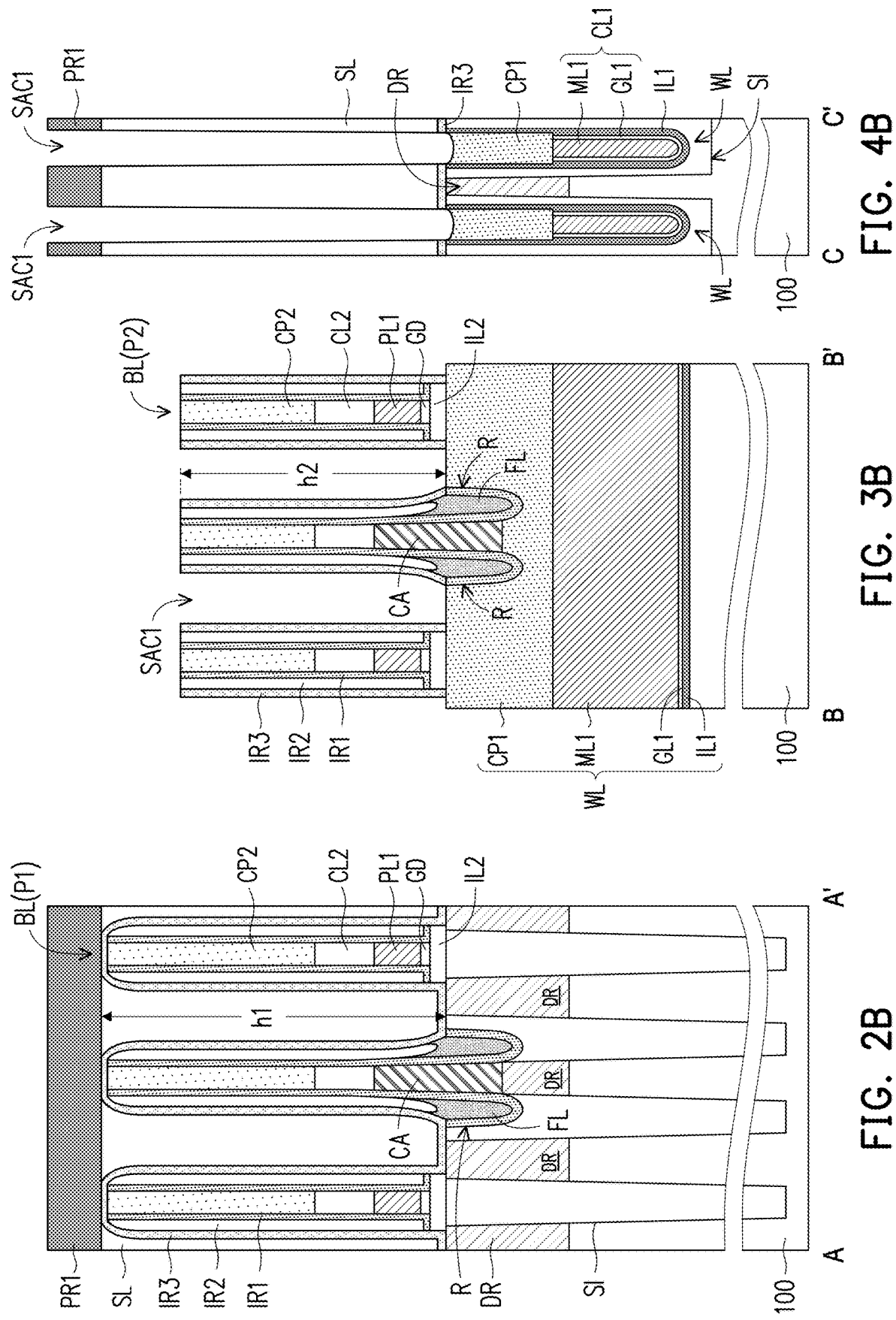

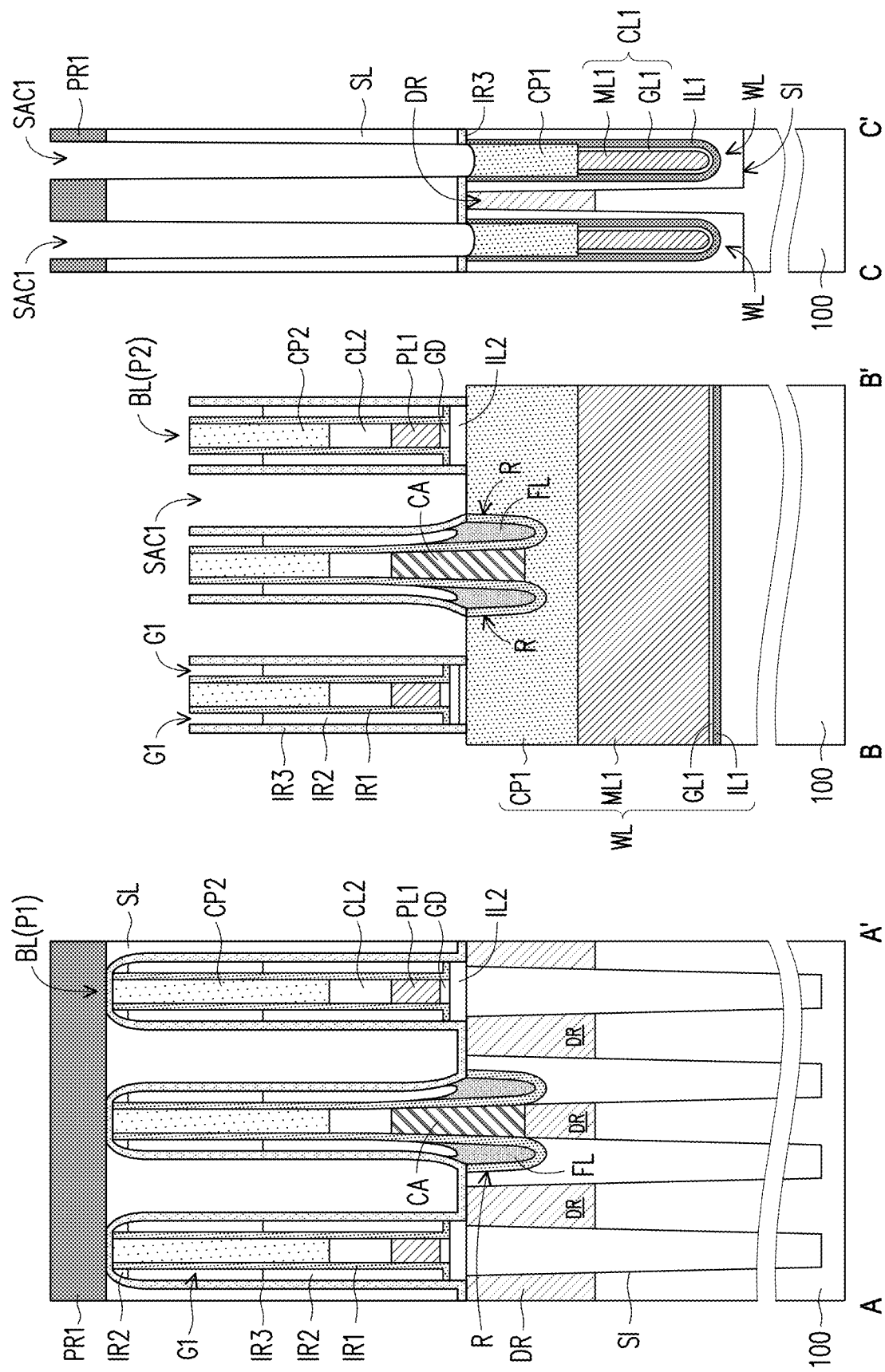

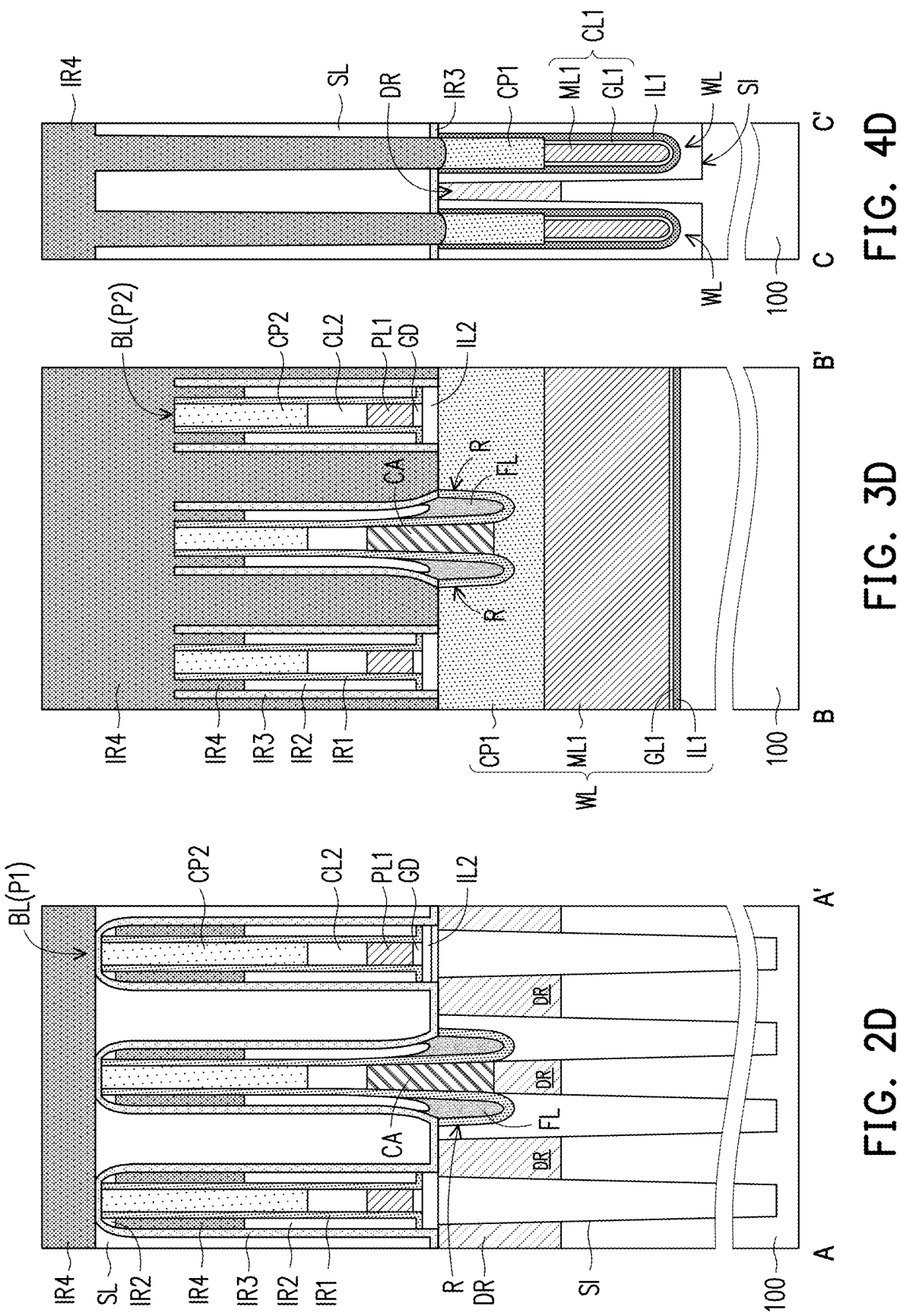

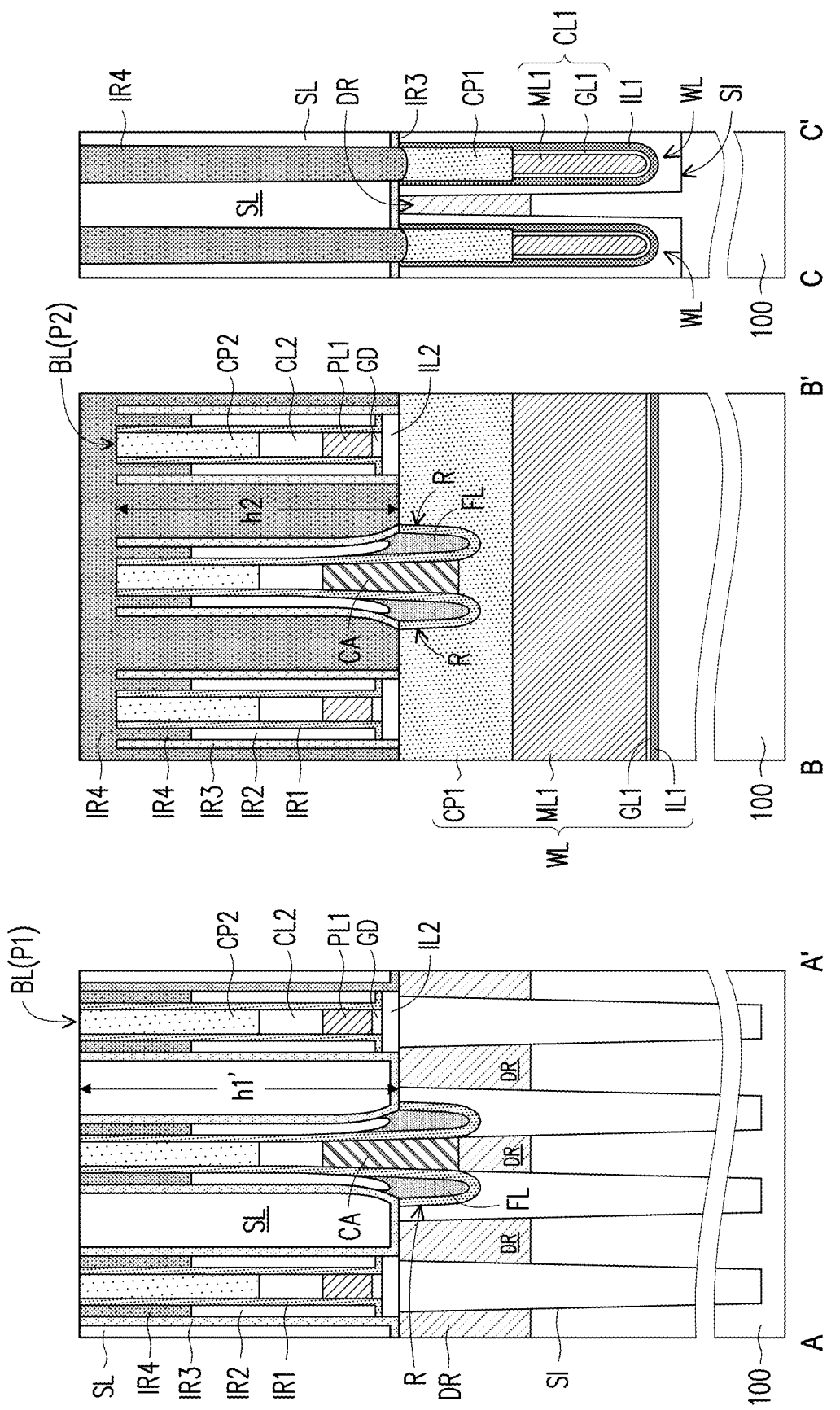

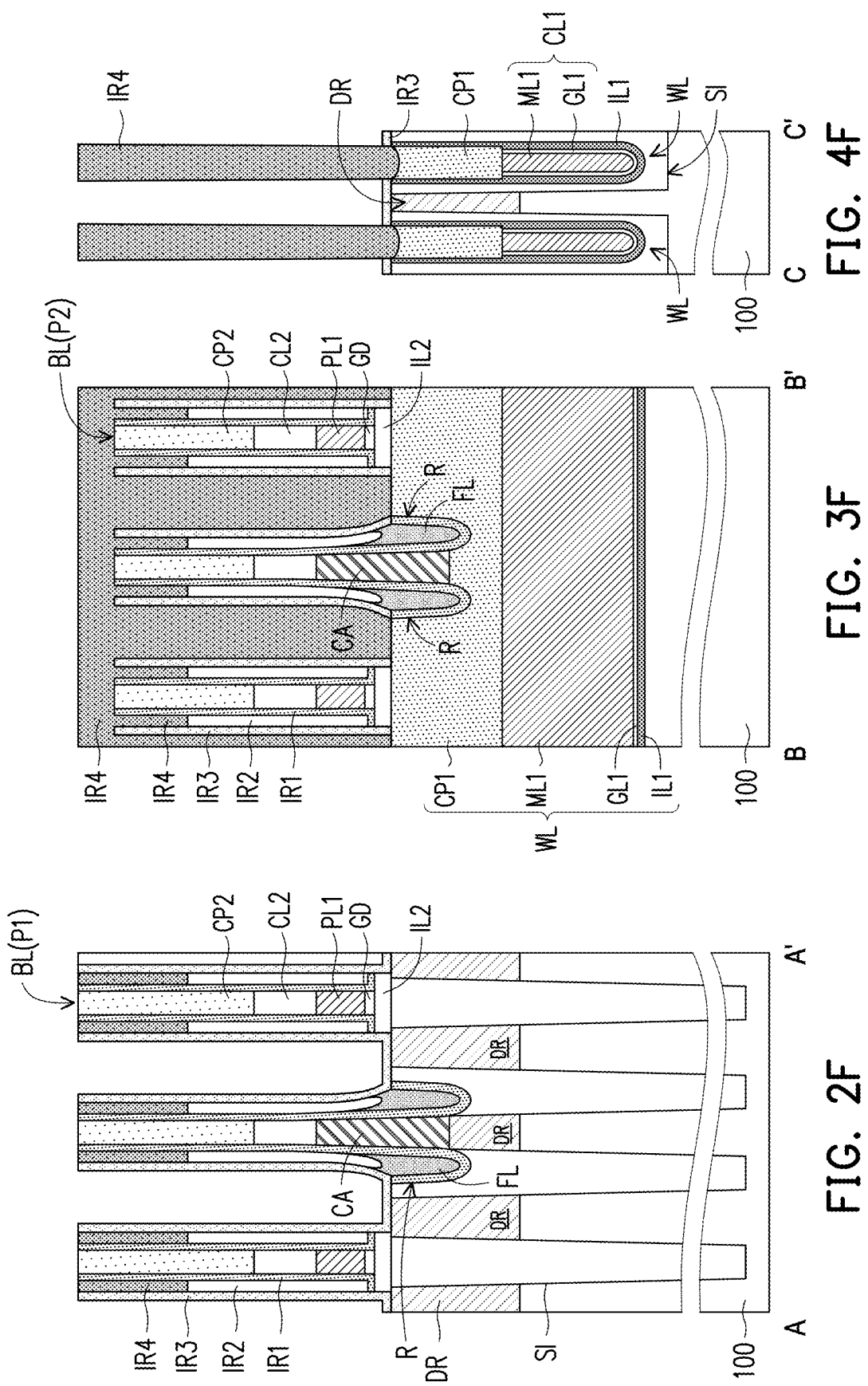

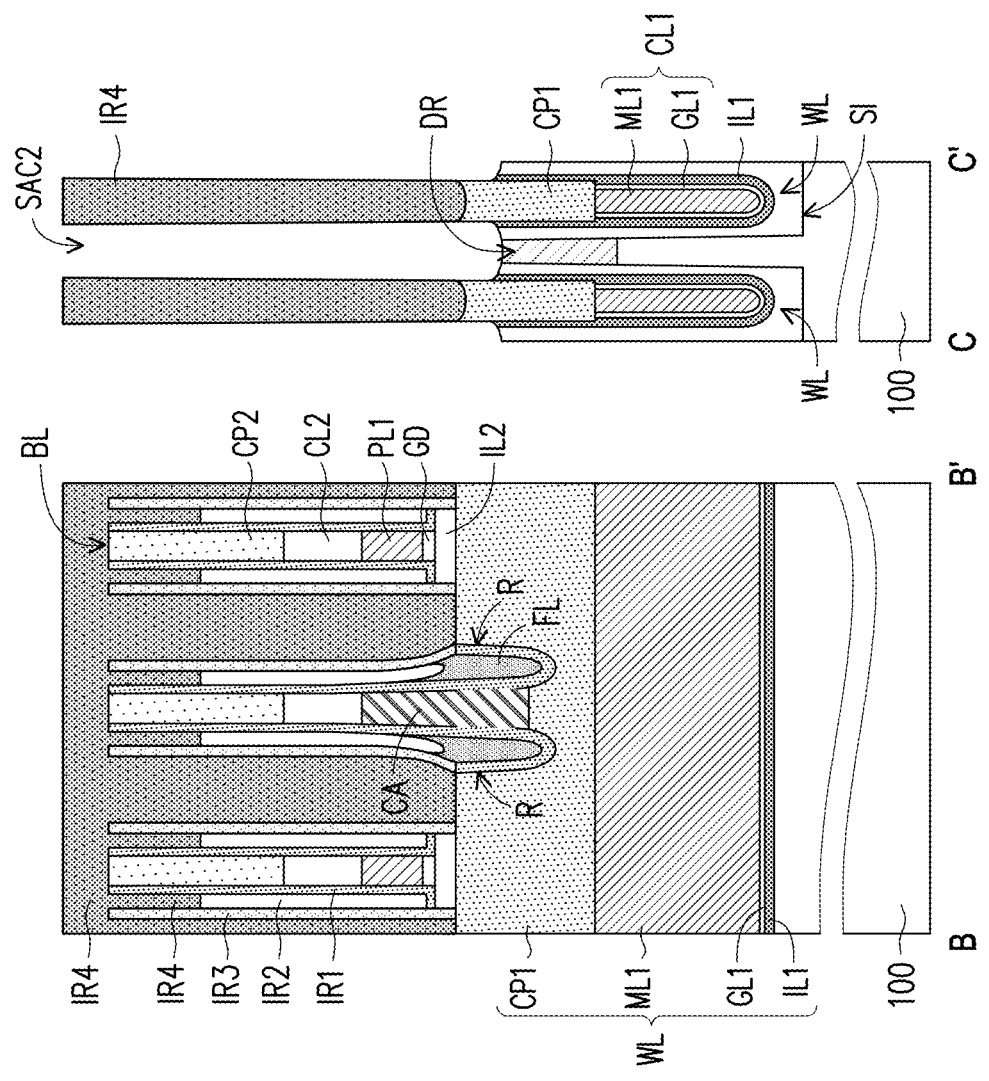
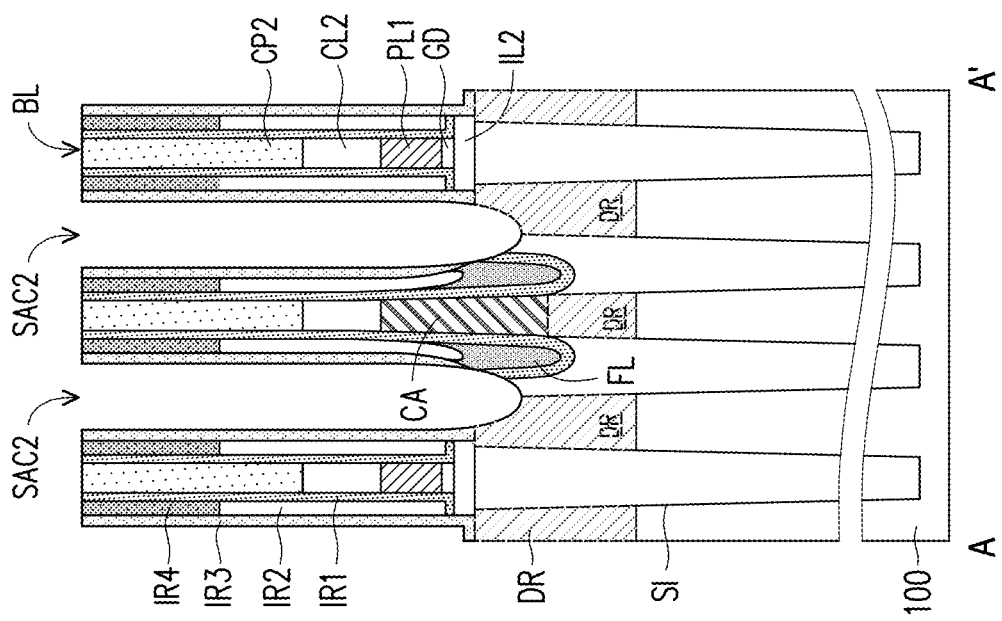

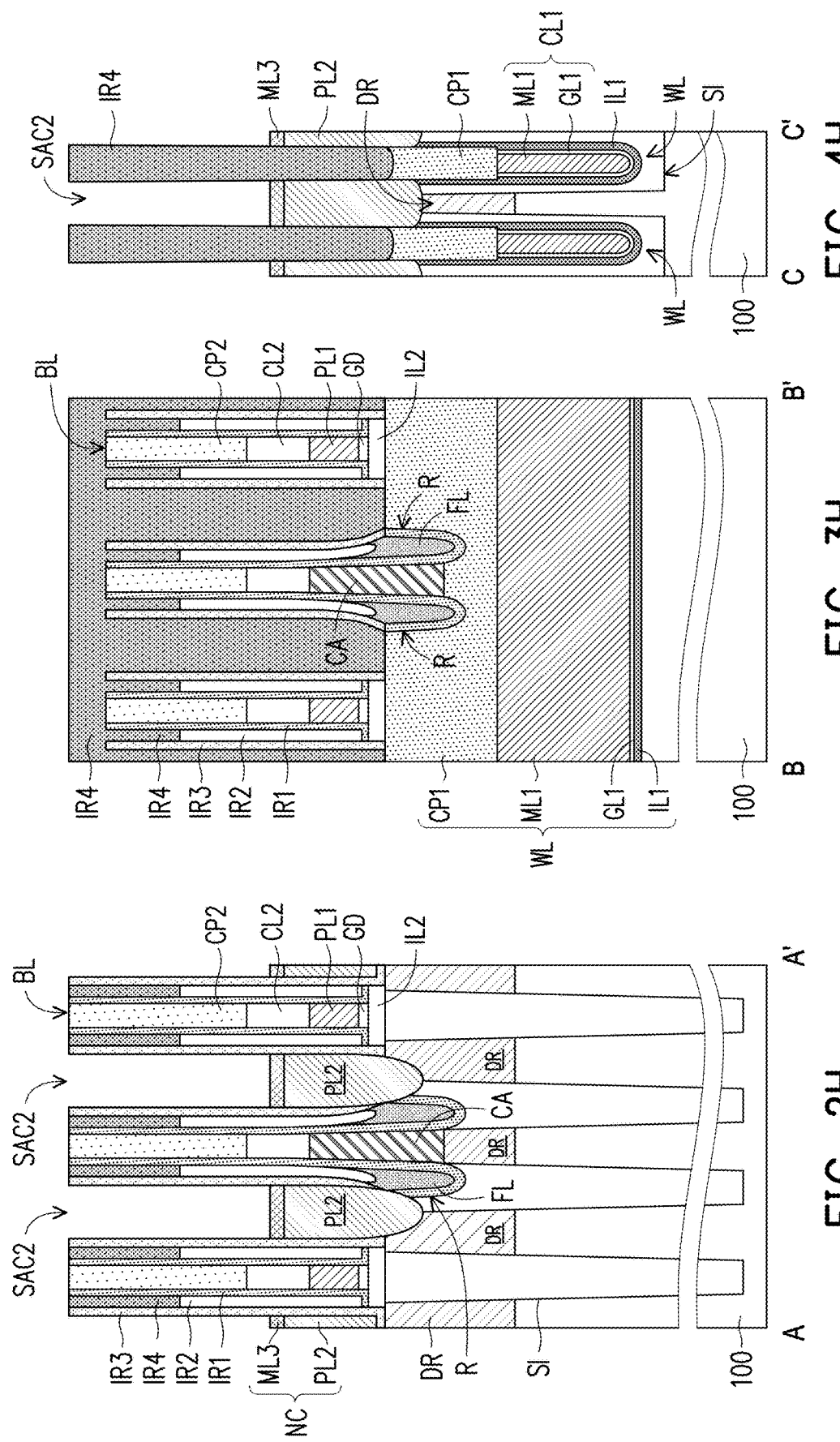

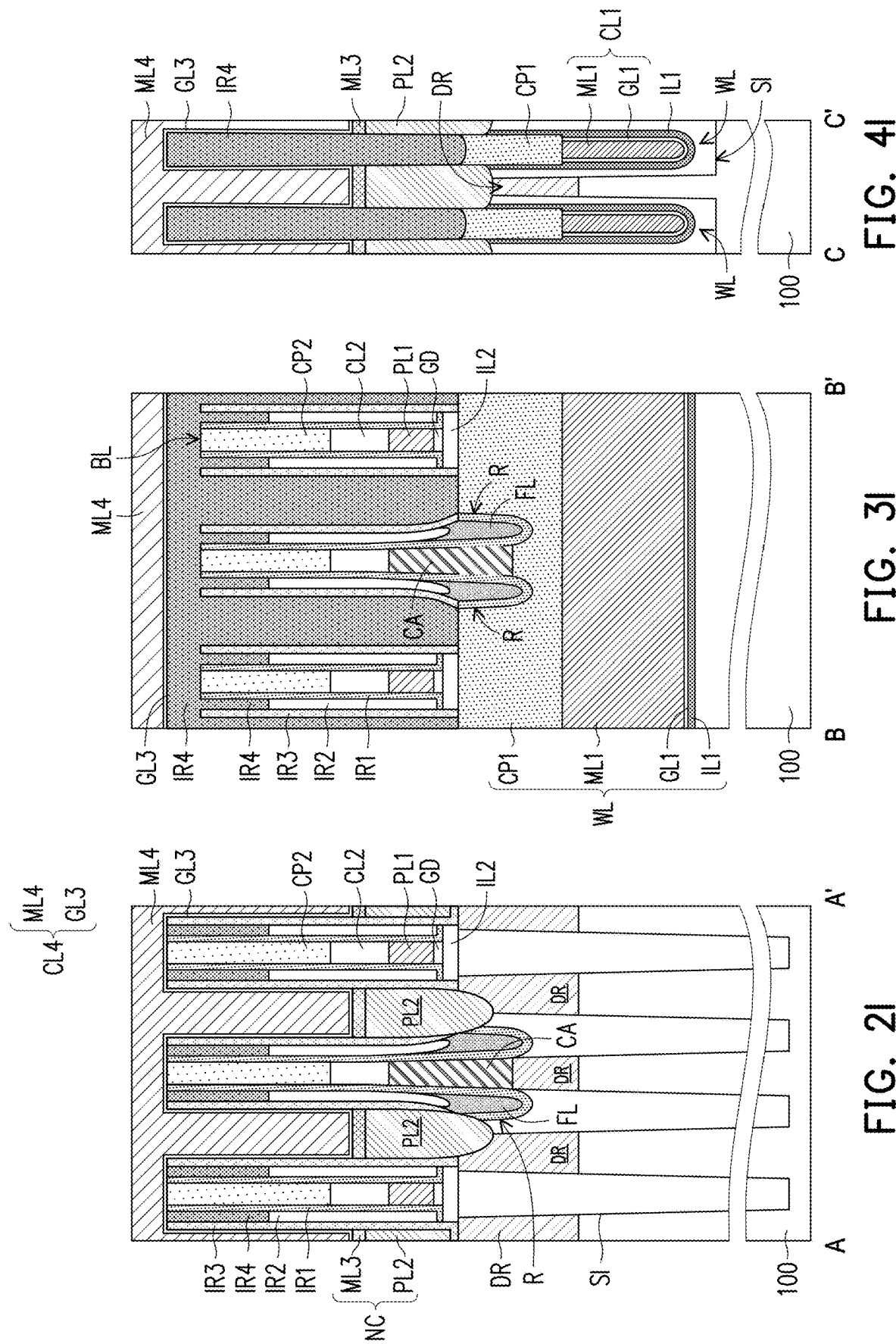

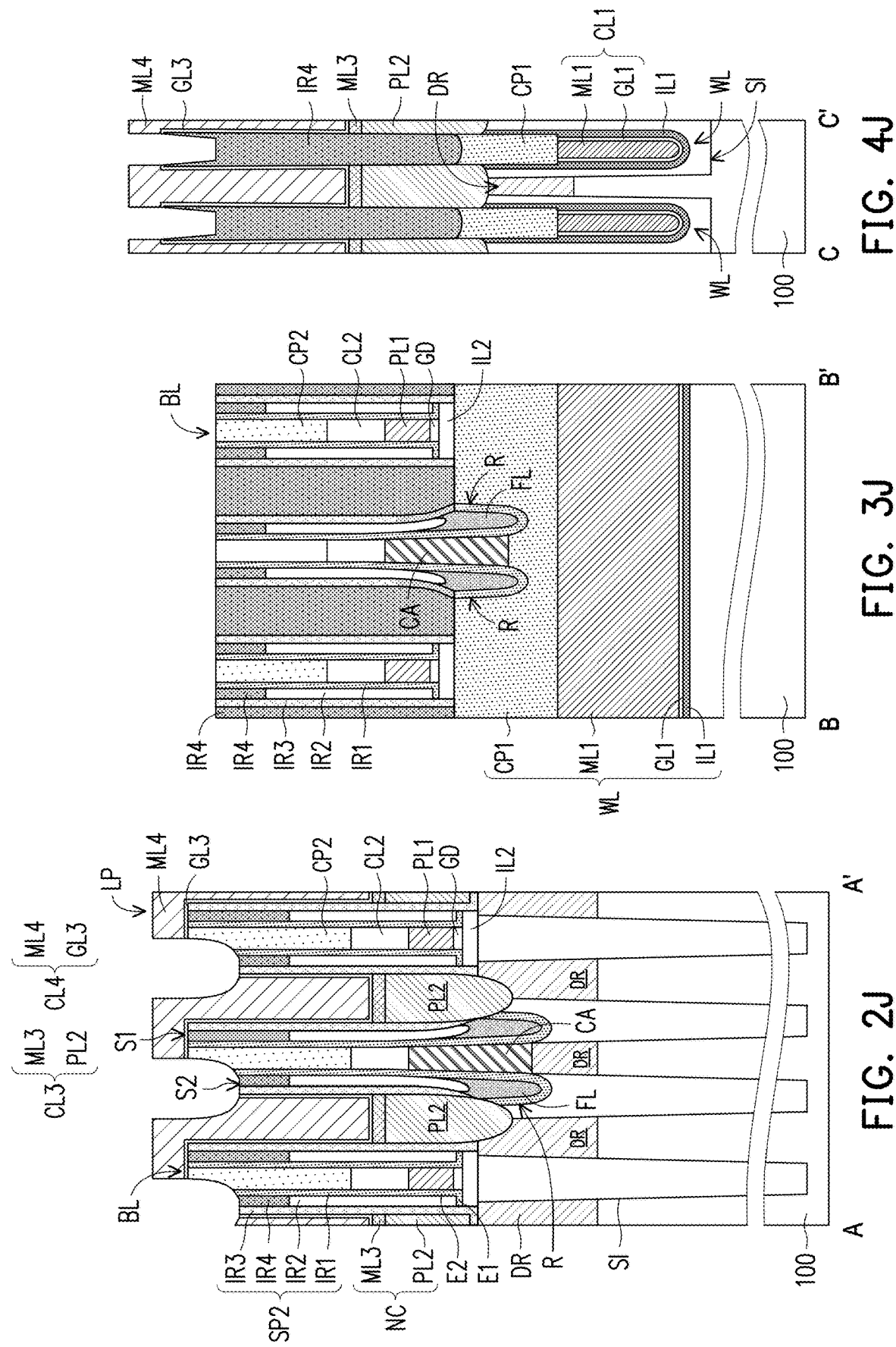

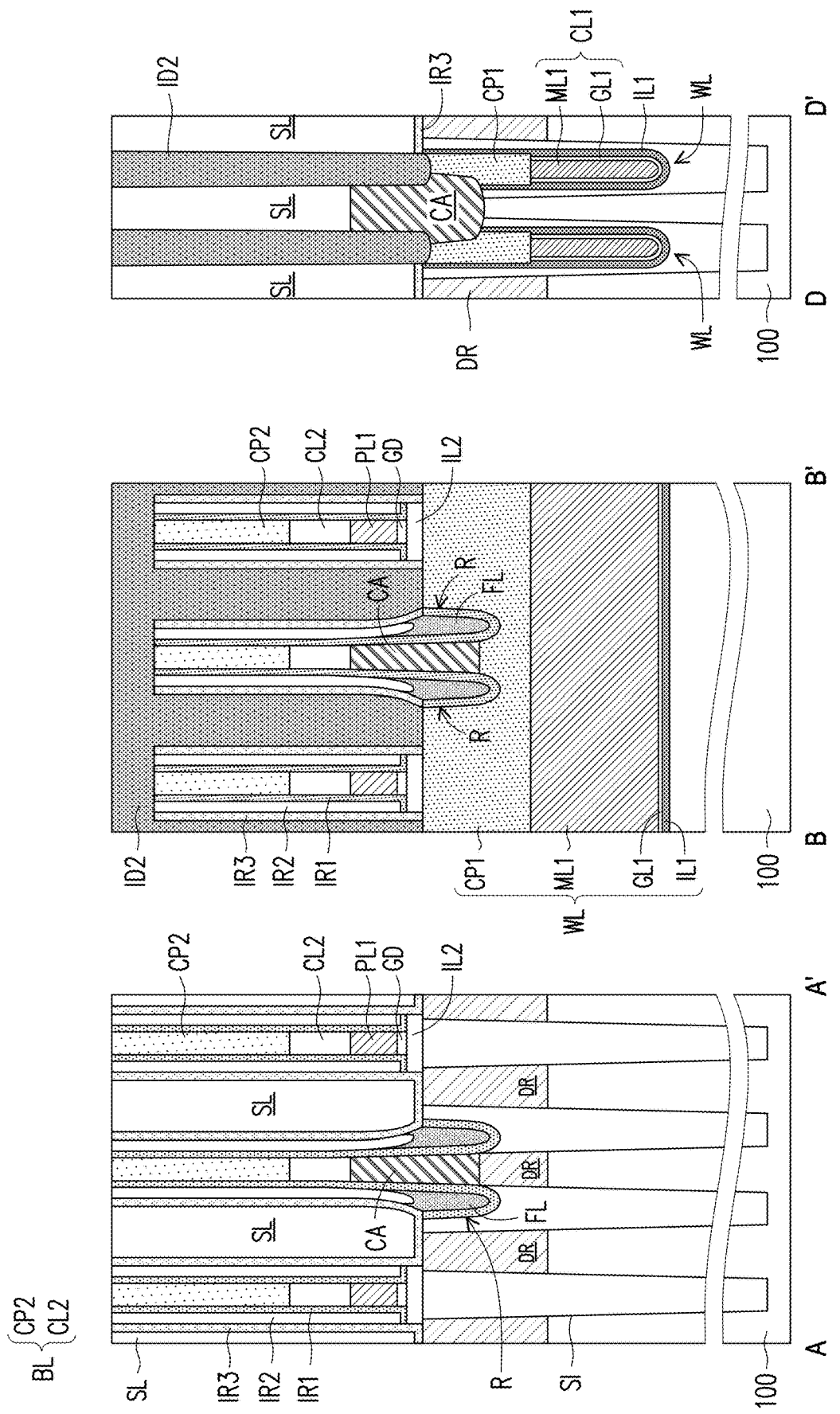

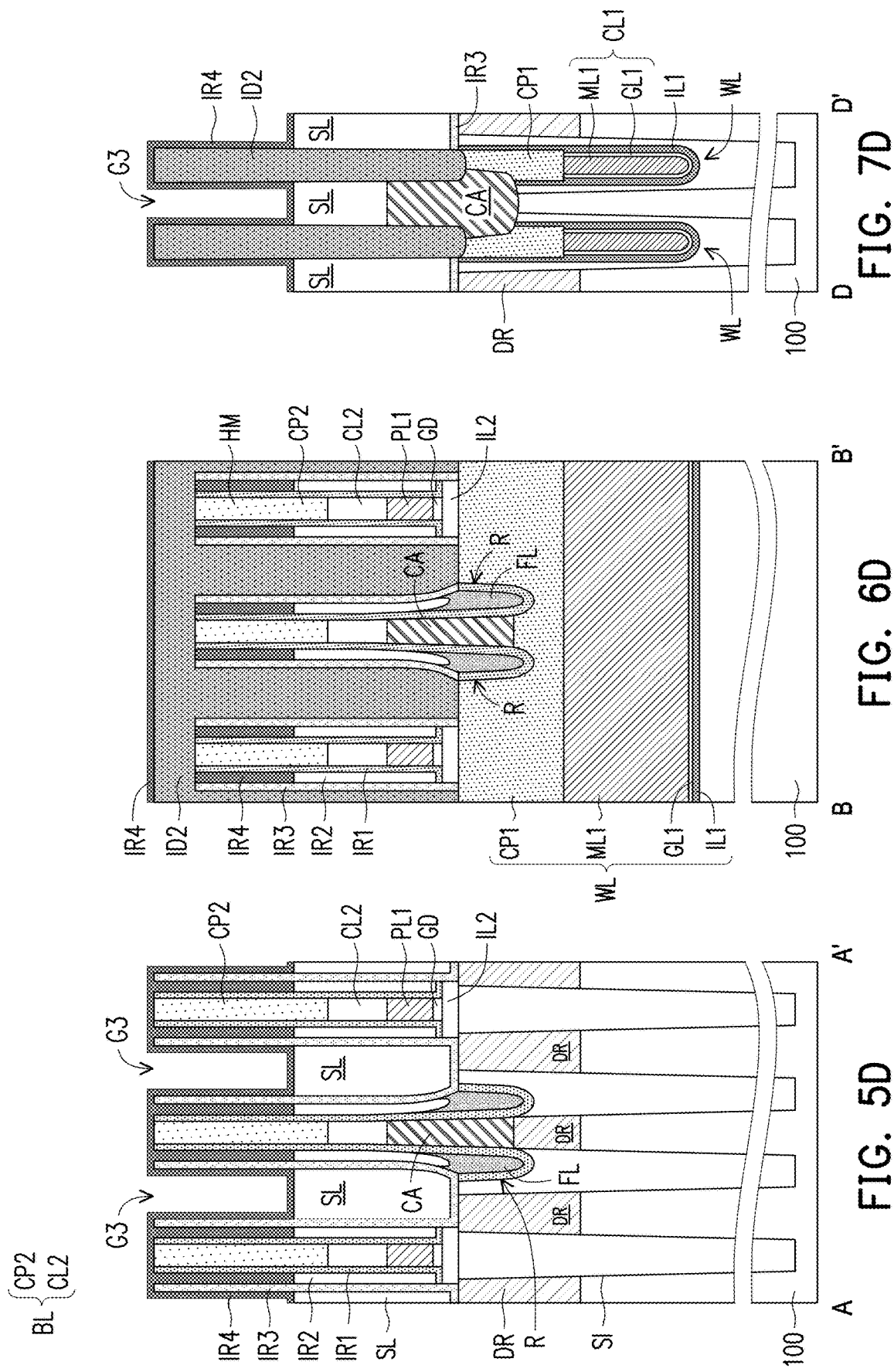

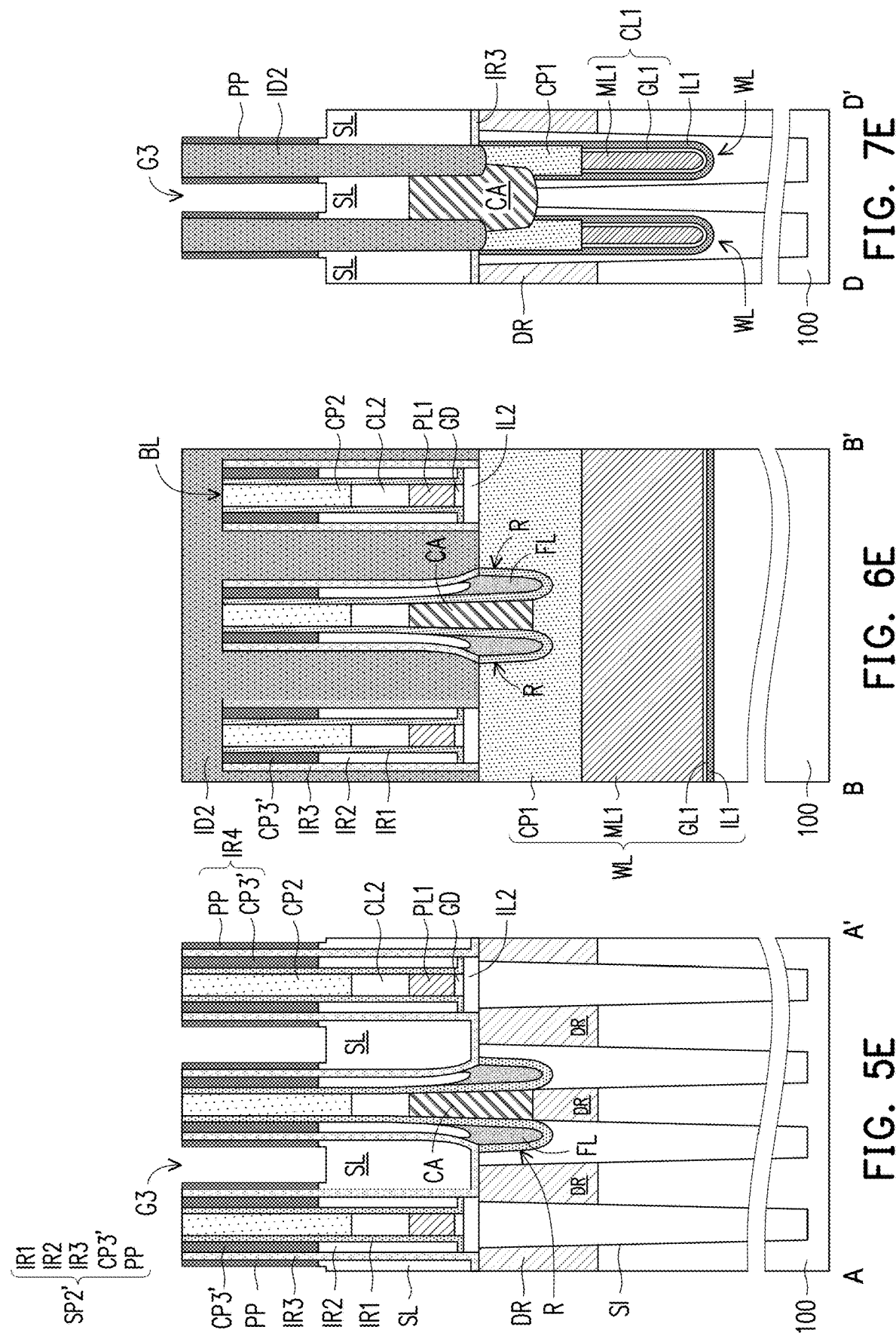

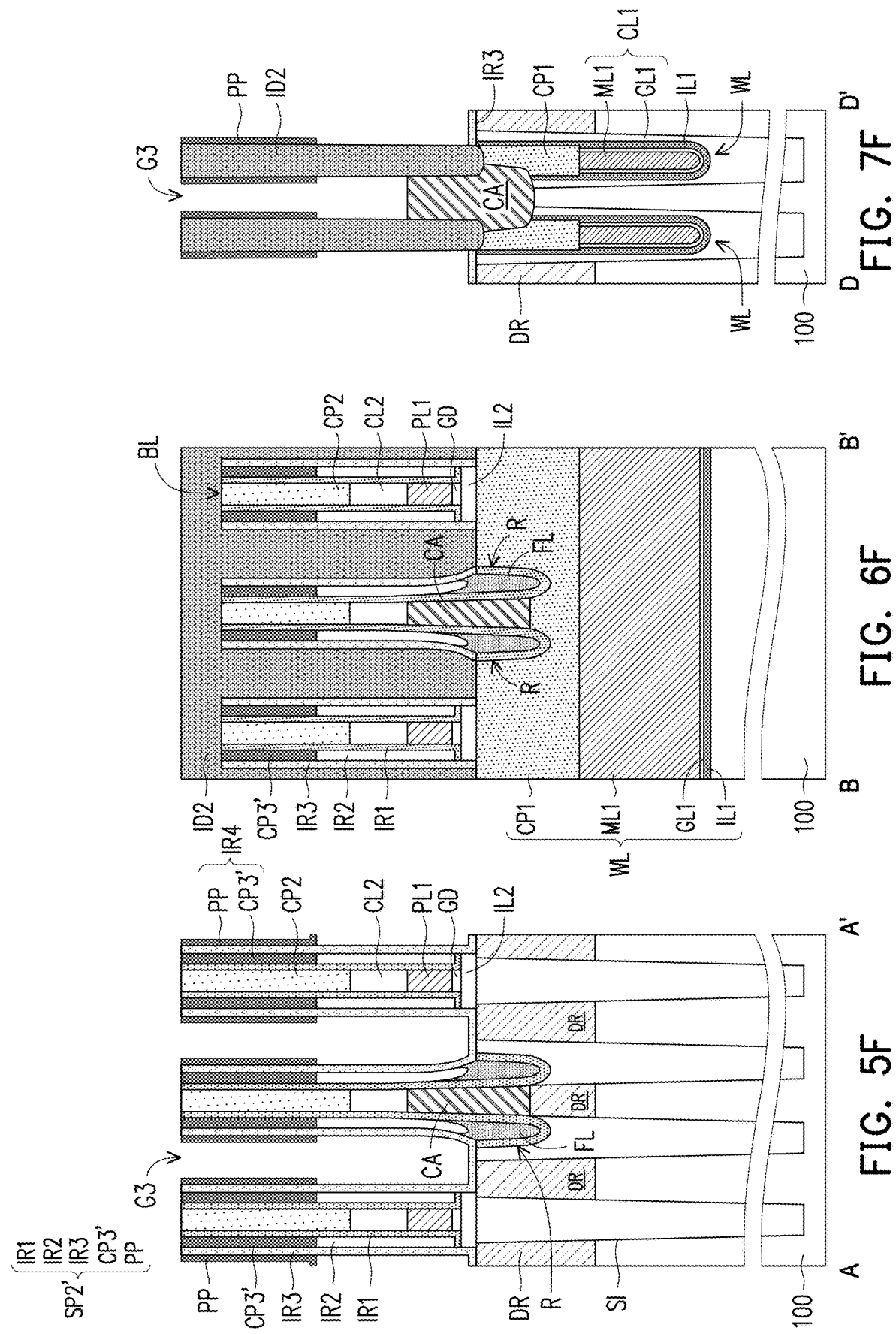

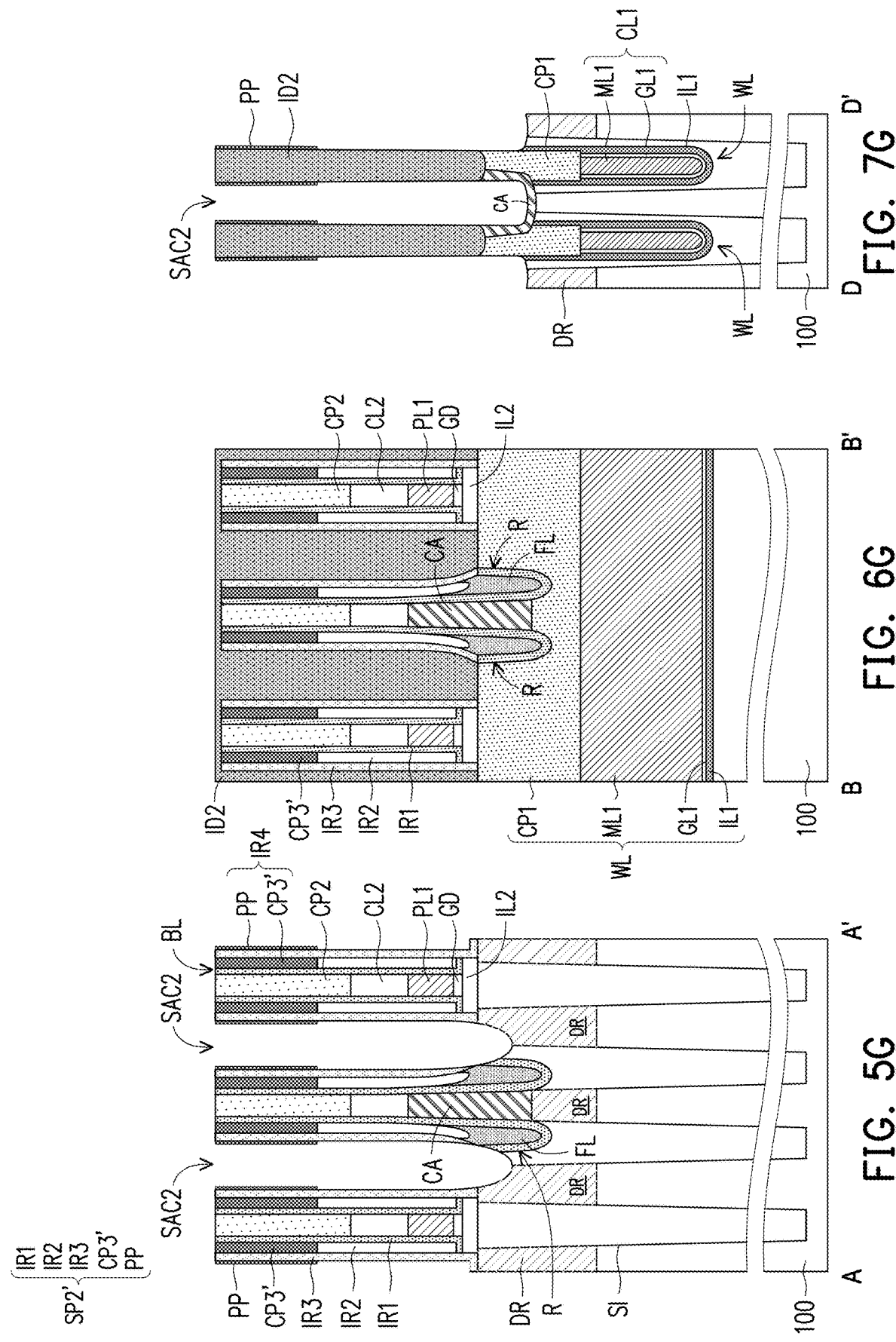

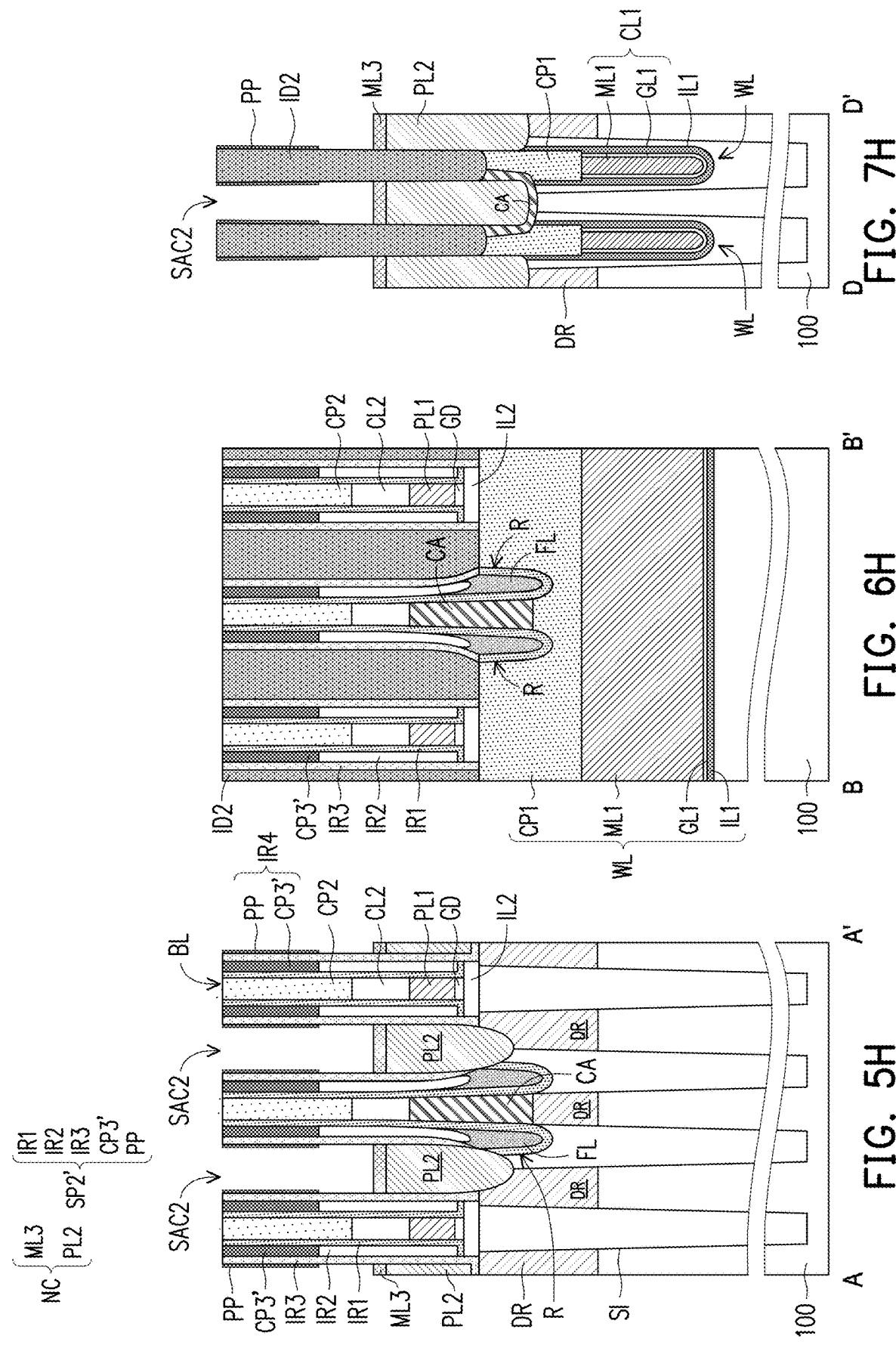

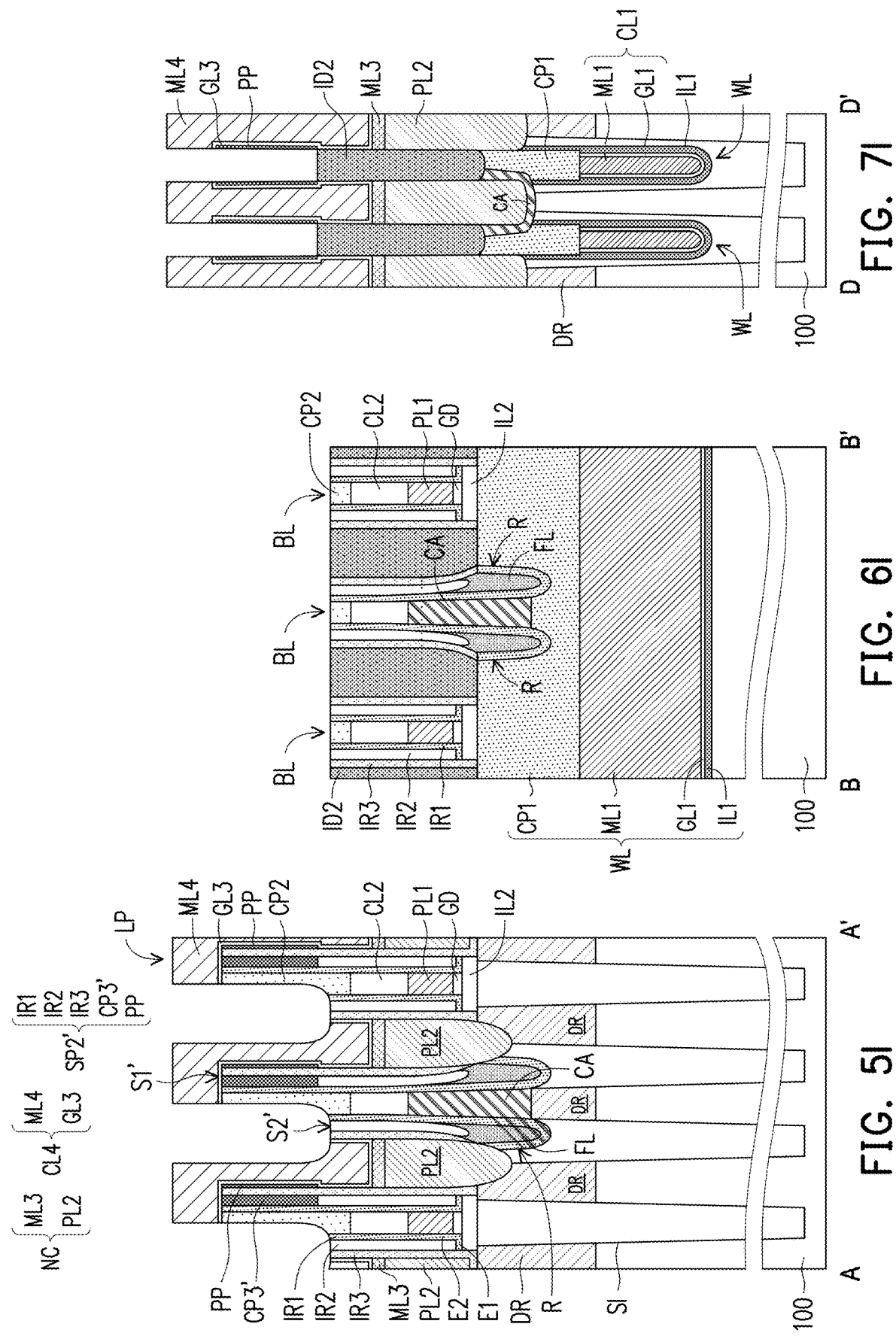

DYNAMIC RANDOM ACCESS MEMORY AND METHOD OF FABRICATING THE SAME

BACKGROUND

Field of the Disclosure

The disclosure relates to a semiconductor device and a manufacturing method thereof, and particularly relates to a dynamic random access memory and a manufacturing method thereof.

Description of Related Art

With the rapid development of technology, in order to meet consumers' demand for miniaturized electronic devices, dynamic random access memory (DRAM) has been designed with reduced size and evolved with high degree of integrity. However, as the device size continues to decrease, it has become more difficult to control the manufacturing process. For example, the spacer made of two nitride layers and one oxide layer disposed therebetween on the sidewall of the bit line stack pattern is easily damaged by etching during the manufacturing process. As a result, the conductive layer formed on the damaged spacer for forming capacitor landing pads is unable to be disconnected during the patterning process, thereby resulting in a short circuit between the capacitor landing pads.

SUMMARY OF THE DISCLOSURE

The disclosure provides a DRAM and a manufacturing method thereof, which can prevent the capacitor landing pads from being short-circuited.

In an embodiment of the disclosure, a DRAM includes a plurality of buried word line structures in a substrate, a plurality of bit line stack patterns on the substrate, and a plurality of spacers located on sidewalls of the plurality of bit line stack patterns. Each of the spacers includes: a first dielectric layer, a second dielectric layer, a third dielectric layer, and a fourth dielectric layer. Thea first dielectric layer is disposed on the sidewalls of the bit line stack pattern. The second dielectric layer is disposed on a sidewall of the first dielectric layer. The third dielectric layer is disposed on a sidewall of the second dielectric layer. A top surface of the second dielectric layer is lower than a top surface of the first dielectric layer and a top surface of the third dielectric layer. The fourth dielectric layer is disposed on the top surface of the second dielectric layer. The second dielectric layer and the fourth dielectric layer are disposed between the first dielectric layer and the third dielectric layer, and the second dielectric layer is made of a dielectric material of which a dielectric constant is lower than that of the first dielectric layer, the third dielectric layer, and the fourth dielectric layer. The plurality of capacitor contacts are electrically connected to active regions in the substrate. Top surfaces of the plurality of capacitor contacts are lower than the top surface of the second dielectric layer. A plurality of capacitor landing pads cover the plurality of capacitor contacts, first portions of the plurality of spacers, and a portion of the plurality of bit line stack pattern. Top surfaces of second portions of the plurality of spacers are not covered by the plurality of capacitor landing pads are lower than top surfaces of the first portions of the plurality of spacers.

In an embodiment of the disclosure, a method of fabricating a DRAM includes the following steps. A plurality of buried word line structures are formed in a substrate. A plurality of bit line stack patterns is formed on the substrate. A plurality of spacers is formed on sidewalls of the plurality of bit line stack patterns. Each of the spacers includes a first dielectric layer, a second dielectric layer, a third dielectric layer, and a fourth dielectric layer. The first dielectric layer is disposed on the sidewalls of the bit line stack pattern. The second dielectric layer is disposed on a sidewall of the first dielectric layer. The third dielectric layer is disposed on a sidewall of the second dielectric layer. A top surface of the second dielectric layer is lower than a top surface of the first dielectric layer and a top surface of the third dielectric layer. The fourth dielectric layer is disposed on the top surface of the second dielectric layer. The second dielectric layer and the fourth dielectric layer are disposed between the first dielectric layer and the third dielectric layer. The second dielectric layer is made of a dielectric material of which a dielectric constant is lower than that of the first dielectric layer, the third dielectric layer, and the fourth dielectric layer. A plurality of capacitor contacts electrically connected to active regions in the substrate. Top surfaces of the plurality of capacitor contacts are lower than the top surface of the second dielectric layer. A plurality of capacitor landing pads cover the plurality of capacitor contacts, first portions of the plurality of spacers, and a portion of the plurality of bit line stack patterns. Top surfaces of second portions of the plurality of spacers not covered by the plurality of capacitor landing pads are lower than top surfaces of the first portions of the plurality of spacers.

Based on the above, in the embodiment of the disclosure, before forming the capacitor contact opening, the upper portion of the second dielectric layer in the spacer of the sidewall of the bit line stack pattern is replaced with the fourth dielectric layer with higher etching selectivity, thereby preventing the spacer from being damaged by etching. Before the patterning of the capacitor landing pad, the spacer still has a sufficient height, and therefore when the capacitor landing pad is patterned, over-etching can be performed to ensure that the adjacent capacitor landing pad can be disconnected, thereby avoiding short circuit from being occurred between the capacitor landing pads.

BRIEF DESCRIPTION OF THE DRAWINGS

FIG. 2A to FIG. 2J are schematic cross-sectional views of FIG. 1A to FIG. 1J taken along line A-A'.

FIG. 3A to FIG. 3J are schematic cross-sectional views of FIG. 1A to FIG. 1J taken along line B-B'.

FIG. 4A to FIG. 4J are schematic cross-sectional views of FIG. 1A to FIG. 1J taken along line C-C'.

FIG. 5A to FIG. 5I are schematic cross-sectional views of a manufacturing method of a semiconductor device according to a second embodiment of the disclosure.

FIG. 6A to FIG. 6I are other schematic cross-sectional views of a manufacturing method of a semiconductor device according to the second embodiment of the disclosure.

FIG. 7A to FIG. 7I are schematic cross-sectional views of a manufacturing method of a semiconductor device according to the second embodiment of the disclosure.

DESCRIPTION OF EMBODIMENTS

Referring to FIG. 1A, FIG. 2A, FIG. 3A, FIG. 4A, a plurality of bit line stack patterns BL disposed on a substrate 100 are provided. Before the formation of the bit line stack patterns BL, isolation structures SI and buried word line structures WL are formed in the substrate 100. The substrate 100 may be a semiconductor material, such as silicon or other suitable materials. The material of the isolation structure SI includes silicon oxide, silicon nitride, or a combination thereof. The isolation structure SI can be formed by a conventional shallow trench isolation method. A plurality of active regions AA separated by the isolation structures SI are defined in the substrate 100. In addition, doped regions DR has been formed in the active region AA of the substrate 100. The doped region DR can be used as the source and drain regions.

Figure 1A:
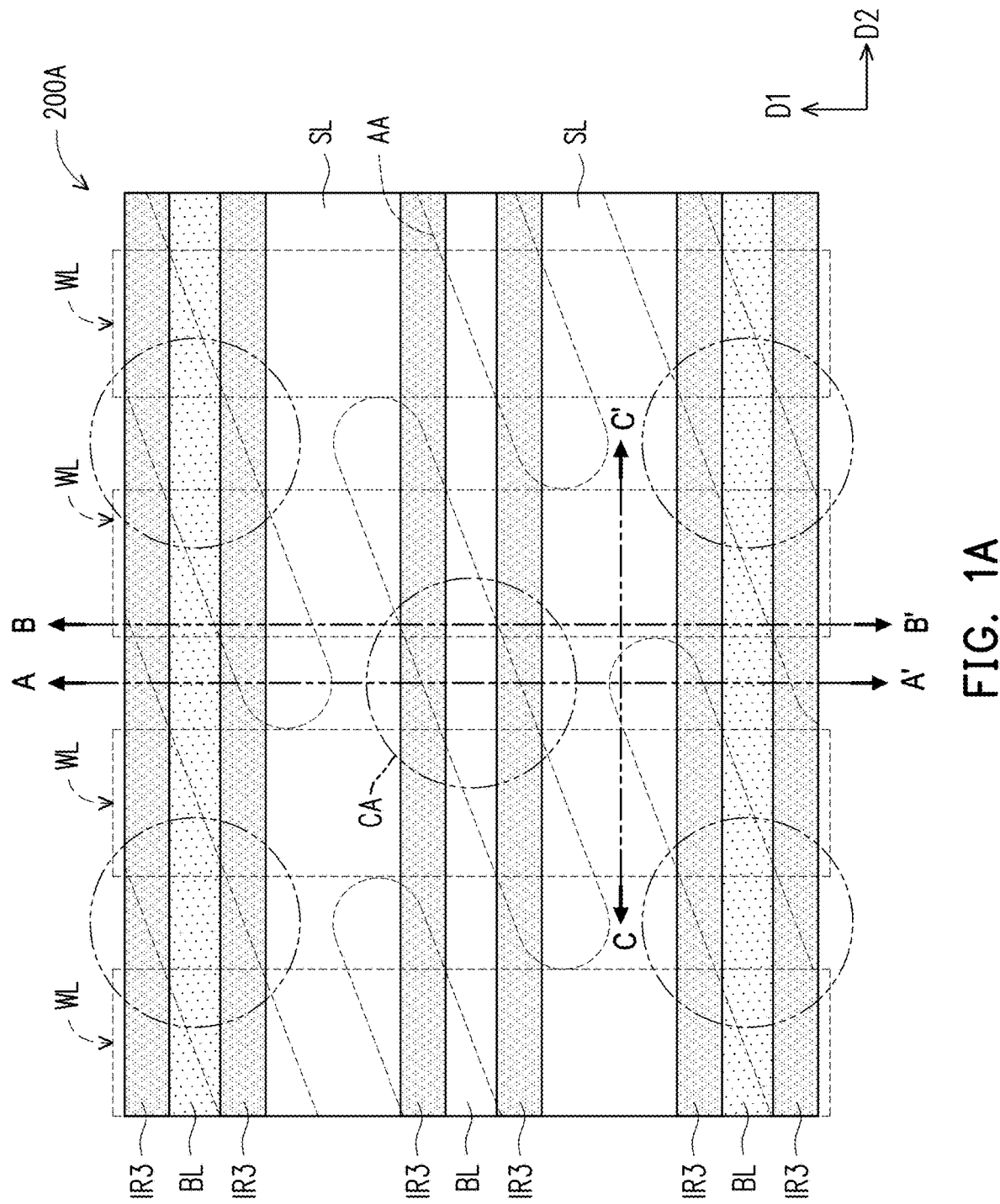
FIG. 1A to FIG. 1J are top views corresponding to different manufacturing steps of a DRAM according to the first embodiment of the disclosure.
Figure 1B:
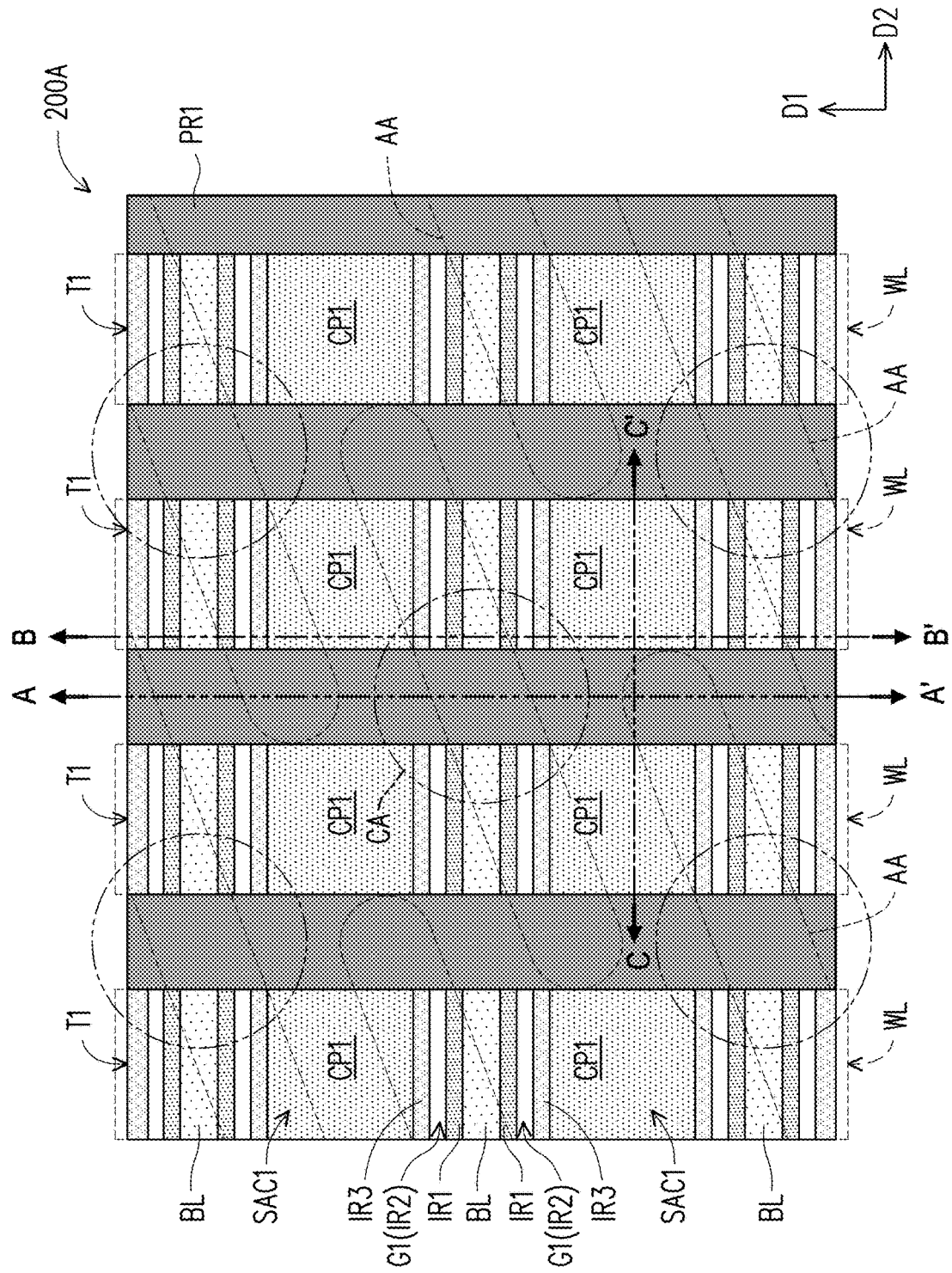
Figure 1C:
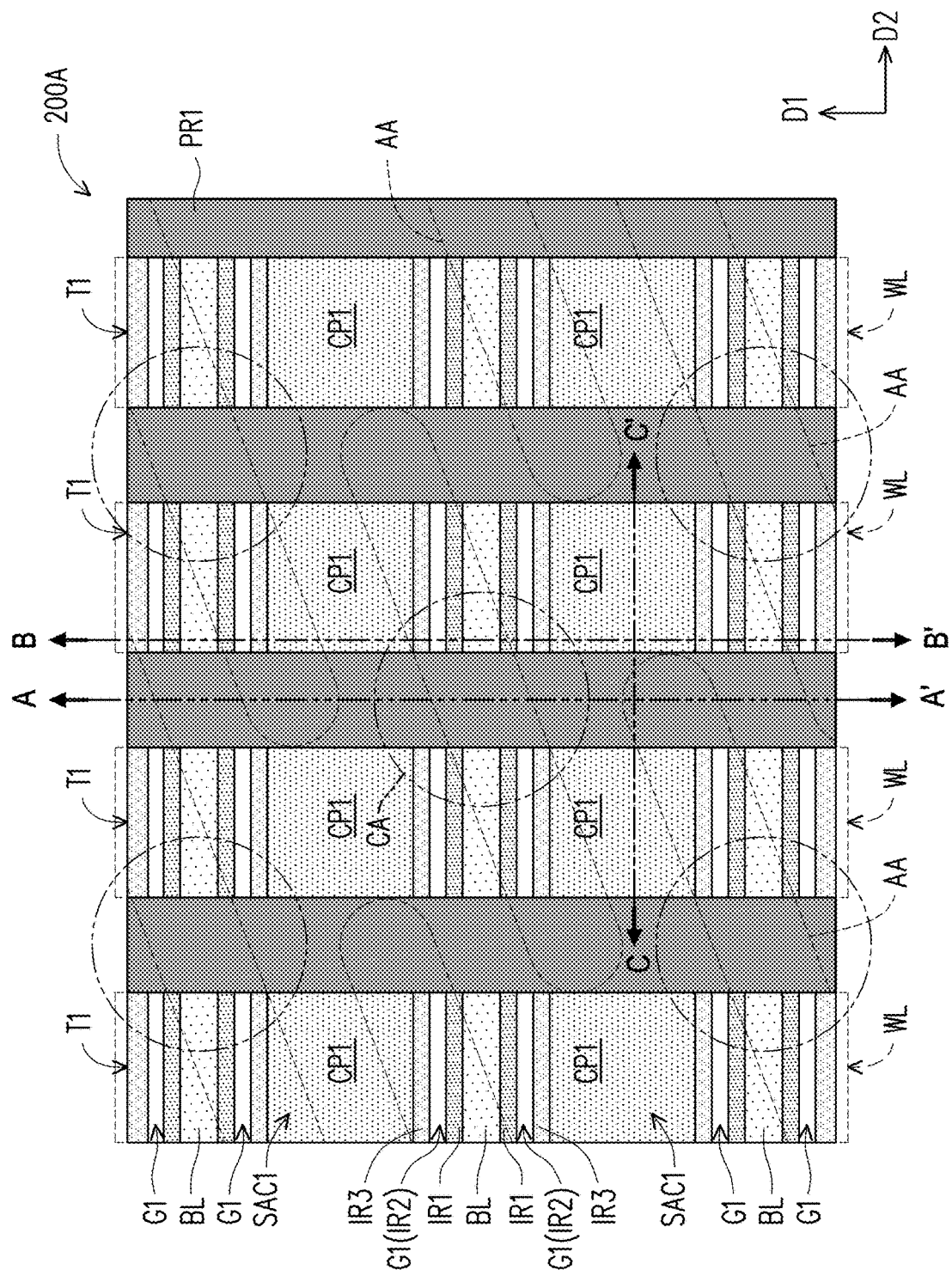
Figure 1D:
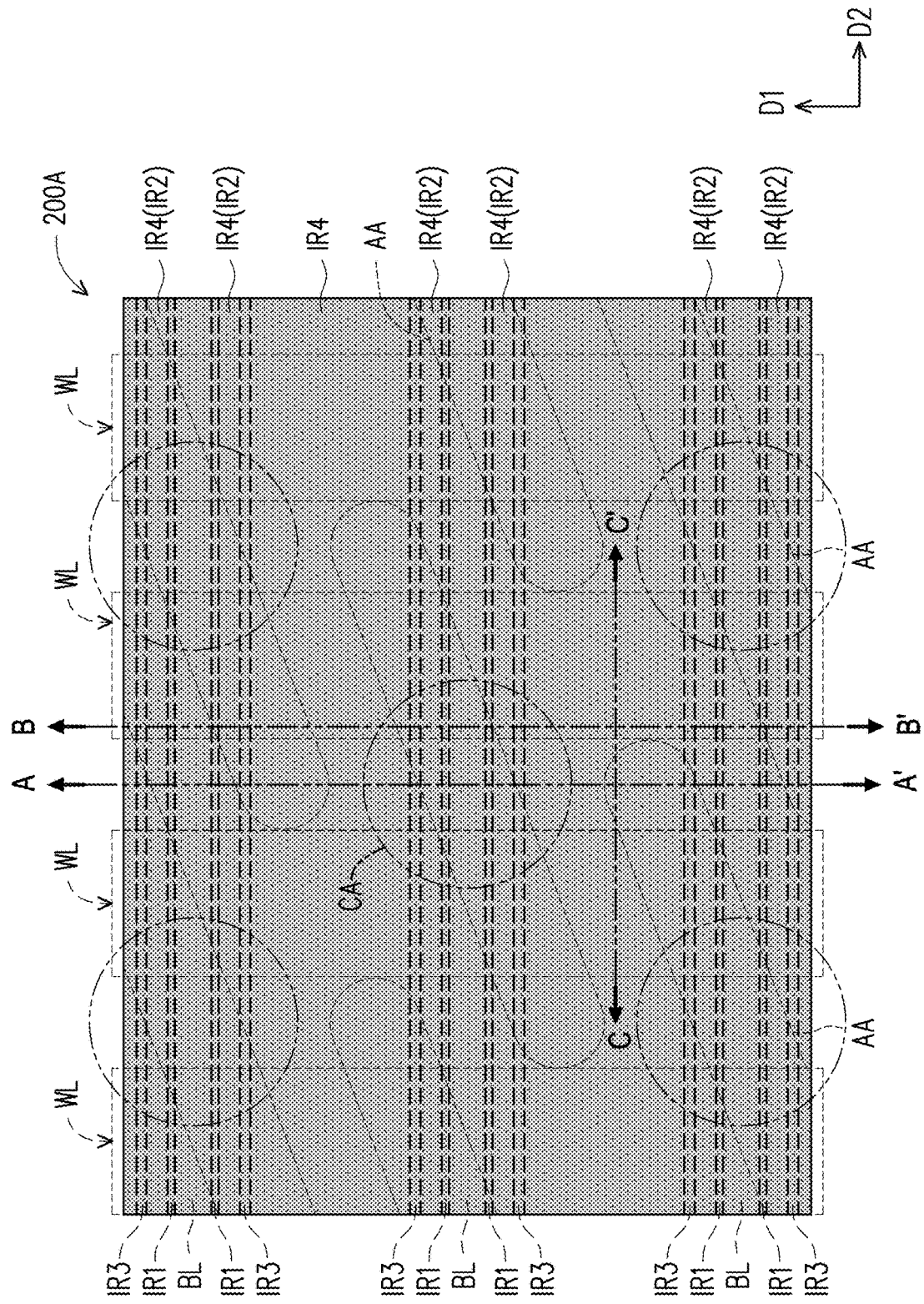
Figure 1E:
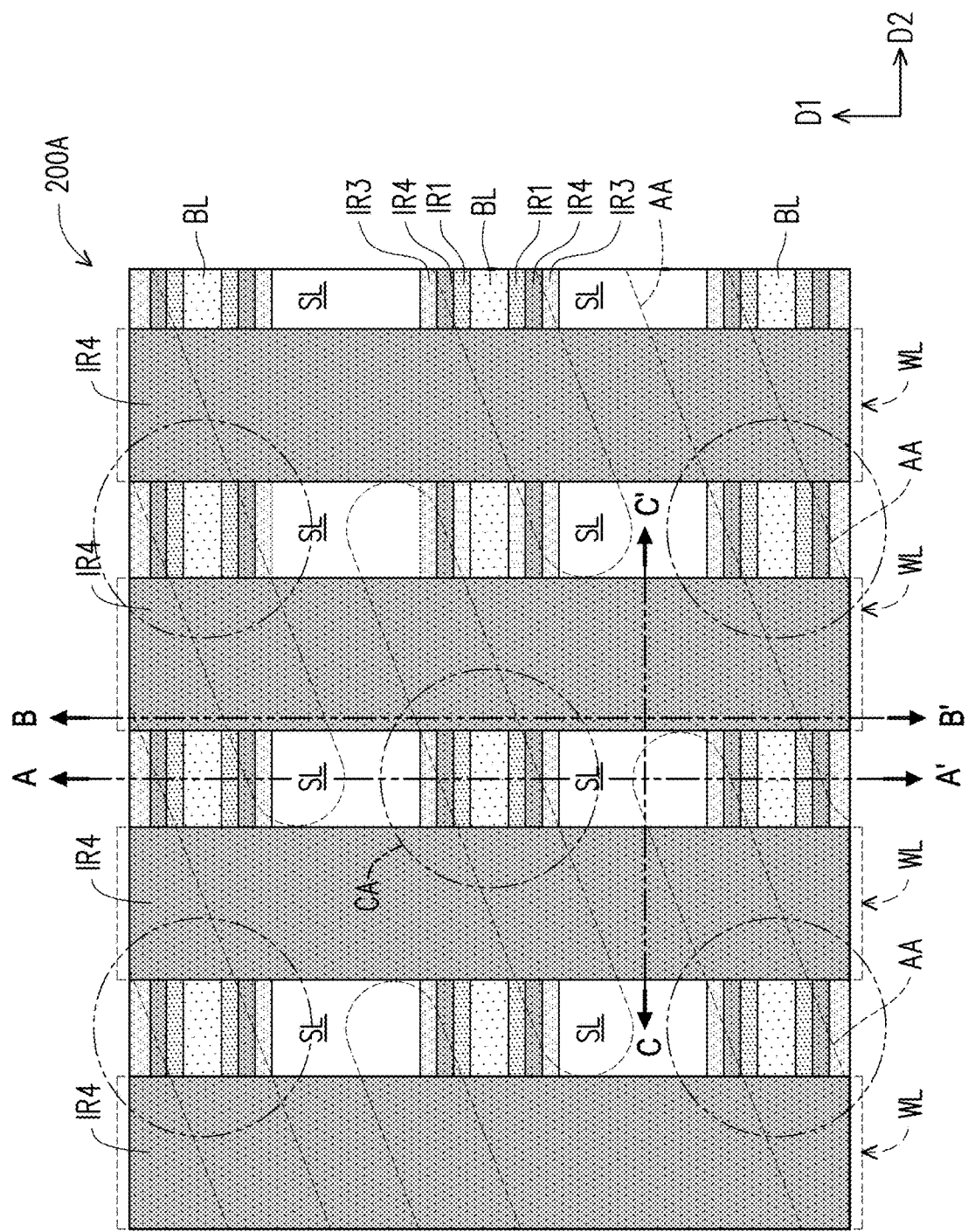
Figure 1F:
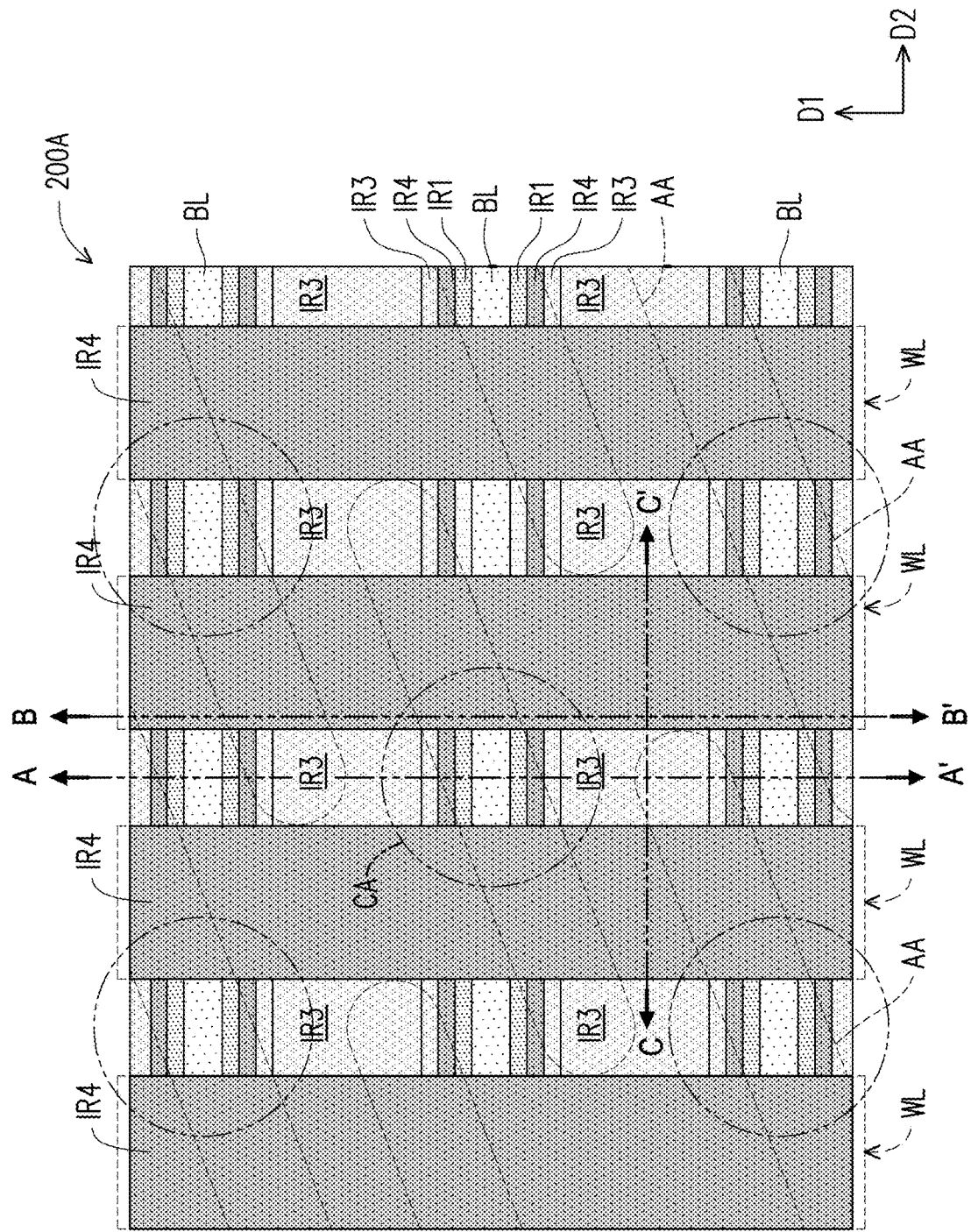
Figure 1G:
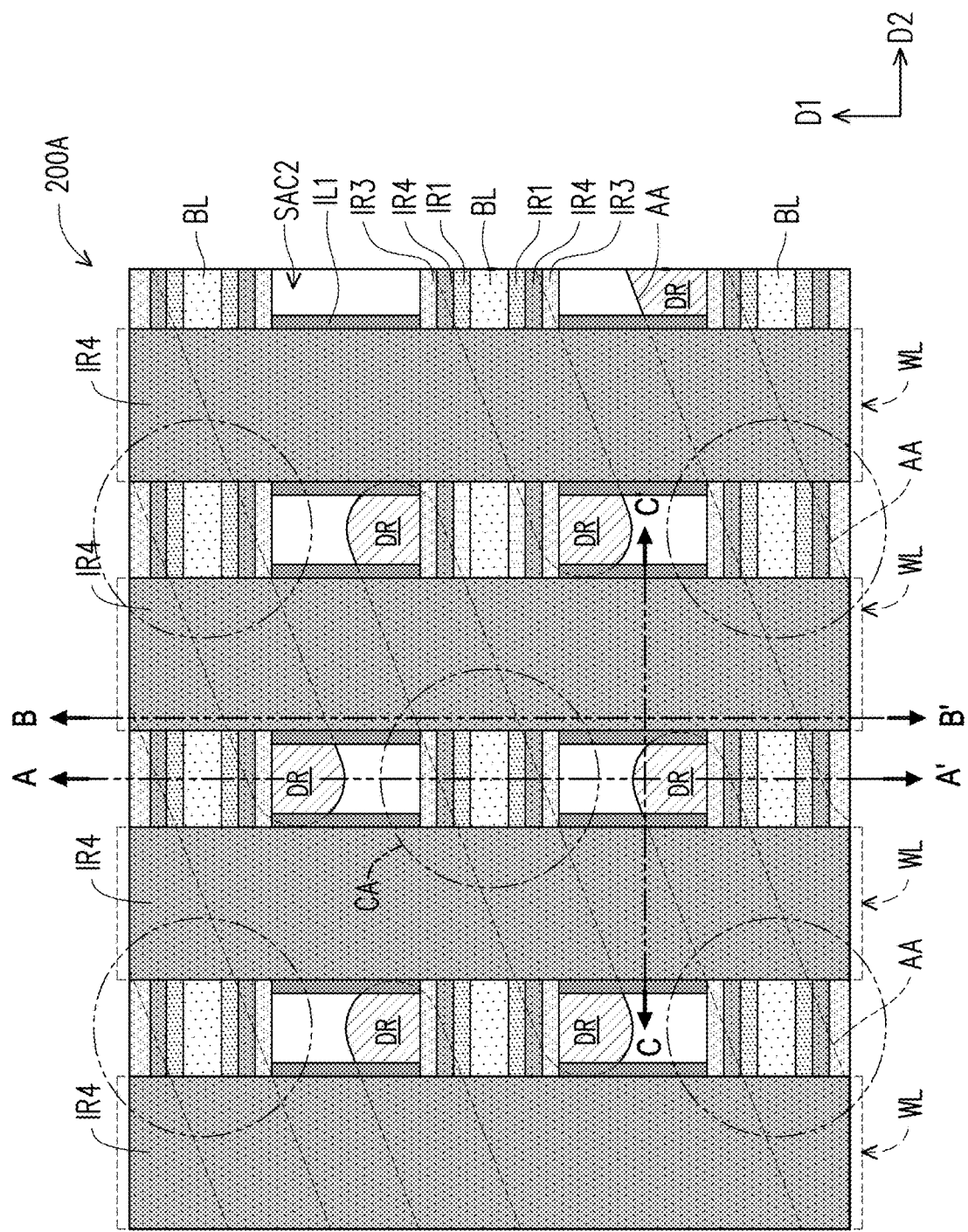

Referring to FIG. 1A, the buried word line structures WL may be parallel to each other, and respectively extend along the first direction D1. In some embodiments, each active region AA is passed through by two buried word line structures WL. Each buried word line structure WL may include an insulating layer IL1, a conductive layer CL1, and a cap layer CP1, which are sequentially formed in a word line trench in the substrate 100. The conductive layer CL1 may include a metal layer ML1 and an adhesive layer GL1. The metal layer ML1 is, for example, tungsten. The adhesive layer GL1 is, for example, titanium, titanium nitride, tantalum, tantalum nitride, or a combination thereof. The material of the cap layer CP1 includes an insulating material, for example, silicon nitride. The material of the insulating layer IL1 may be silicon oxide.

After the formation of the buried word line structures WL, referring to FIG. 2A, FIG. 3A, and FIG. 4A, an insulating layer IL2 is formed on the substrate 100, and then is patterned to expose portions of the active region AA to be contacted to the afterward formed bit line contacts CA. Next, a dielectric layer GD, a semiconductor layer PL1, a bit line contact material, a conductive layer CL2 and a cap layer CP2 are formed on the substrate 100, and are etched to form a plurality of bit line contacts CA on the doped regions DR, and a plurality of bit line stack patterns BL on the bit line contacts CA and the patterned semiconductor layer PL1. After the bit line contacts CA is formed, a plurality of recesses R are formed, in which each recess R surrounds the bottom portion of the bit line contact CA. The patterned bit line contact material forms the bit line contacts CA. The bit line stack patterns BL include the patterned conductive layer CL2 and the patterned cap layer CP2. The dielectric layer GD is formed between the semiconductor layer PL1 and the insulating layer IL2. The insulating layer IL2 is formed between the substrate 100 and the dielectric layer GD.

The material of the insulating layer IL2 may include, silicon oxide, silicon nitride or a combination thereof. The dielectric layer GD and the semiconductor layer PL1 may be used to form the gate dielectric layer and the gate of the transistor in the peripheral region, respectively. The semiconductor layer PL1 may include doped polysilicon. The bit line contact material may include doped polysilicon or metal. The conductive layer CL2 may include a barrier layer such as titanium, titanium nitride, tantalum, tantalum nitride, tungsten silicide (WSi), tungsten nitride (WN) or a combination thereof, and a metal or a metal silicide such as tungsten (W), tungsten silicide (WSi), cobalt silicide, or a combination thereof. The material of the cap layer CP2 may include silicon nitride.

Referring to FIG. 1A, the bit line stack patterns BL may be parallel to each other and extend along the second direction D2. An acute angle is formed between the extension direction of the bit line stack pattern BL and the long axis of the active region AA. The conductive layer CL2 of the bit line stack pattern BL is electrically connected to the doped region DR through the bit line contact CA. The active regions AA, the doped regions DR, the buried word line structures WL, the bit line contacts CA, and the bit line stack patterns BL can be made by conventional solutions, therefore the detailed description therefor is omitted here.

Next, a first dielectric layer IR1 is conformally formed on surfaces of the bit line stack patterns BL, the bit line contacts CA and the recesses R. Then, a filling layer FL is formed on the first dielectric layer IR1 to fill up the recess R, a second dielectric layer IR2 is conformally formed on the first dielectric layer IR1 and the filling layer FL, and then the second dielectric layer IR2, the first dielectric layer IR1, and the insulating layer IL2 are etched back to remove the horizontal part thereof, so as to expose part of the active region AA and the top surface of the cap layer CP2. Thereafter, a third dielectric layer IR3 is conformally formed on the exposed surfaces of the active region AA, the second dielectric layer IR2 and the cap layer CP2, and then a sacrificial layer SL is formed on the third dielectric layer IR3 to have a top surface coplanar to the top surface of third dielectric layer IR3 on the bit line stack pattern BL.

The material of the second dielectric layer IR2 is different from the material of the first dielectric layer IR1, the third dielectric layer IR3 and the sacrificial layer SL. The second dielectric layer IR2 is made of a dielectric material having a dielectric constant lower than those of the first dielectric layer IR1 and the third dielectric layer IR3. The material of the first dielectric layer IR1 is, for example, silicon oxynitride or silicon nitride. The second dielectric layer IR2 may be made of a dielectric material has an etching rate higher than that of the sacrificial layer SL during the subsequent wet etching process shown in FIG. 2C, FIG. 3C, and FIG. 4C, for example, silicon oxide formed by molecular layer deposition (MLD), or atomic layer deposition (ALD). The material of the filling layer FL is, for example, silicon nitride. The dielectric constant of the third dielectric layer IR3 is different from the second dielectric layer IR2. The material of the third dielectric layer IR3 is, for example, silicon oxynitride or silicon nitride. The sacrificial layer SL is, for example, spin-on glass, silicon oxide and so on.

Referring to FIG. 1B, FIG. 2B, FIG. 3B, and FIG. 4B, a mask layer PR1 is formed on the substrate 100. The mask layer PR1 has a plurality of openings T1 each extending in the first direction D1. Each opening T1 exposes the sacrificial layer SL above the buried word line structure WL, and the third dielectric layer IR3. Thereafter, a patterning process is performed to form a plurality of reverse self-aligned contact holes SAC1 for defining the complementary positions of capacitor contacts. Such patterning process may include a self-aligned double patterning process. After the patterning process, the reverse self-aligned contact hole SAC1 exposes the cap layer CP1 of the buried word line structure WL. During the patterning process, the sacrificial layer SL which is not covered by the mask layer PR1 will be fully removed. And, the cap layer CP2, the third dielectric layer IR3, the second dielectric layer IR2 and the first dielectric layer IR1 that are not covered by the mask layer PR1 will be partially removed, thus a plurality of etched bit line stack patterns BL(P2) are formed. The top surface of the cap layer CP2 of the etched bit line stack pattern BL(P2) and the top surface of the etched third dielectric layer IR3 have a height h2 from the top surface of the cap layer CP1, and the height h2 is smaller than the height h1 of the top surface of the third dielectric layer IR3 formed on the bit line stack pattern BL(P1) from the top surface of the substrate 100. As shown in FIG. 2B, the bit line stack pattern BL(P1) is located in the range covered by the mask layer PR1.

Referring to FIG. 1C, FIG. 2C, FIG. 3C, and FIG. 4C, after the reverse self-aligned contact holes SAC1 are formed, an etching process is performed to remove the upper portion of the second dielectric layer IR2, thereby forming a trench G1 extending along the second direction D2. The etch process may be a wet etch process using an etchant in which the etch rate of the second dielectric layer IR2 is greater than the etch rate of the sacrificial layer SL, so that the sacrificial layer SL may be left after the etch process. The trench G1 aside the bit line stack pattern BL(P1) is defined by the first dielectric layer IR1, the remaining second dielectric layer IR2 and the third dielectric layer IR3. In this embodiment, as show in FIG. 2C, a part of the trench G1 is enclosed by the remaining second dielectric layer IR2 and the third dielectric layer IR3. To decrease bit line parasitic capacitance, the bottom surface of the trench G1 is higher than the top surface of the conductive layer CL2. For example, the bottom surface of the trench G1 is lower than the top surface of the first dielectric layer IR1 and higher than the top surface of the conductive layer CL2. For example, the bottom surface of the trench G1 is lower than the top surface of the cap layer CP2 and higher than the bottom surface of the cap layer CP2. In the embodiment of the disclosure, the step of removing the upper portion of the second dielectric layer IR2 and the step of forming the reverse self-aligned contact hole SAC1 can adopt the same mask layer PR1, so the cost of the photomask and the manufacturing process can be saved.

Referring to FIG. 1D, FIG. 2D, FIG. 3D and FIG. 4D, after forming the reverse self-aligned contact holes SAC1 and the trench G1, the mask layer PR1 is removed. After that, a fourth dielectric layer IR4 is formed on the sacrificial layer SL, and fills into the reverse self-aligned contact holes SAC1 and the trenches G1. The material of the fourth dielectric layer IR4 is different from the materials of the second dielectric layer IR2 and the sacrificial layer SL. The material of the fourth dielectric layer IR4 is, for example, silicon nitride. In addition, under the trench G1, the top surface of the second dielectric layer IR2 is higher than the top surface of the conductive layer CL2, and the bottom surface of the second dielectric layer IR2 is lower than the bottom surfaces of the conductive layer CL2 and the semiconductor layer PL1. Therefore, the sidewalls of the conductive layer CL2 and the semiconductor layer PL1 are still covered by a stack of the first dielectric layer IR1, the second dielectric layer IR2, and the third dielectric layer IR3 (e.g., silicon nitride/silicon oxide/silicon nitride). Compared with the fourth dielectric layer IR4, the second dielectric layer IR2 has the lower dielectric constant, and therefore, by controlling the height of the bottom surface of the fourth dielectric layer IR4 in the trench G1 as mentioned above, the DRAM 200A can have a lower bit line parasitic capacitance.

Referring to FIG. 1E, FIG. 2E, FIG. 3E, and FIG. 4E, a removal process, such as a chemical mechanical polishing process, or a blanket dry etch back process, is performed on the fourth dielectric layer IR4 to remove the extra fourth dielectric layer IR4 until the sacrificial layer SL is exposed. In order to ensure that the sacrificial layer SL can be exposed, the upper portion of the bit line stack pattern BL(P1) may be partially removed during the removal process, so the height h1 (as shown in FIG. 2B) is decreased to be height h1'. The height h1' may be equal to or greater than the height h2.

During the removal process, the remaining second dielectric layer IR2 (shown in FIG. 2D) between the fourth dielectric layer IR4 and the third dielectric layer IR3 may be removed due to excessive polishing, causing the fourth dielectric layer IR4 to be exposed. In some embodiments, during the blanket dry etch back process, the dry etch rates of the second dielectric layer IR2 and the sacrificial layer SL are similar, and lower than that of the fourth dielectric layer IR4. Therefore, the remaining second dielectric layer IR2 can protect the fourth dielectric layer IR4 underneath from being damaged by etching, and ensure that the height h1 or h1' still has a sufficient height after the removal process.

Referring to FIG. 1F, FIG. 2F, FIG. 3F, and FIG. 4F, a mask layer (not shown) covering the peripheral region and exposing the memory cell region is formed on the substrate 100. Next, the sacrificial layer SL is removed and expose the third dielectric layer IR3. Since the materials of the cap layer CP2, the first dielectric layer IR1, the third dielectric layer IR3, and the fourth dielectric layer IR4 are different from the material of the sacrificial layer SL, the sacrificial layer SL can be easily removed by wet etching.

Referring to FIG. 1G, FIG. 2G, FIG. 3G, and FIG. 4G, an etching process such as an anisotropic etching process is performed on the third dielectric layer IR3 to form a plurality of self-aligned capacitor contact holes SAC2 exposing the doped regions DR in the substrate 100. The vertical thicknesses of the cap layer CP2, the first dielectric layer IR1, and the fourth dielectric layer IR4 that are formed on the sidewalls of the bit line stack patterns BL are thicker than that of the third dielectric layer IR3 which is horizontally formed on the substrate 100. Therefore, during etching the third dielectric layer IR3, the cap layer CP2, the first dielectric layer IR1, and the fourth dielectric layer IR4 can protect the underlying conductive layer CL2 and the second dielectric layer IR2 from being exposed. In some embodiments, in order to ensure that the surface of the substrate 100 can be exposed, over-etching is performed, which causes that part of the substrate 100 is also etched.

Figure 1H:
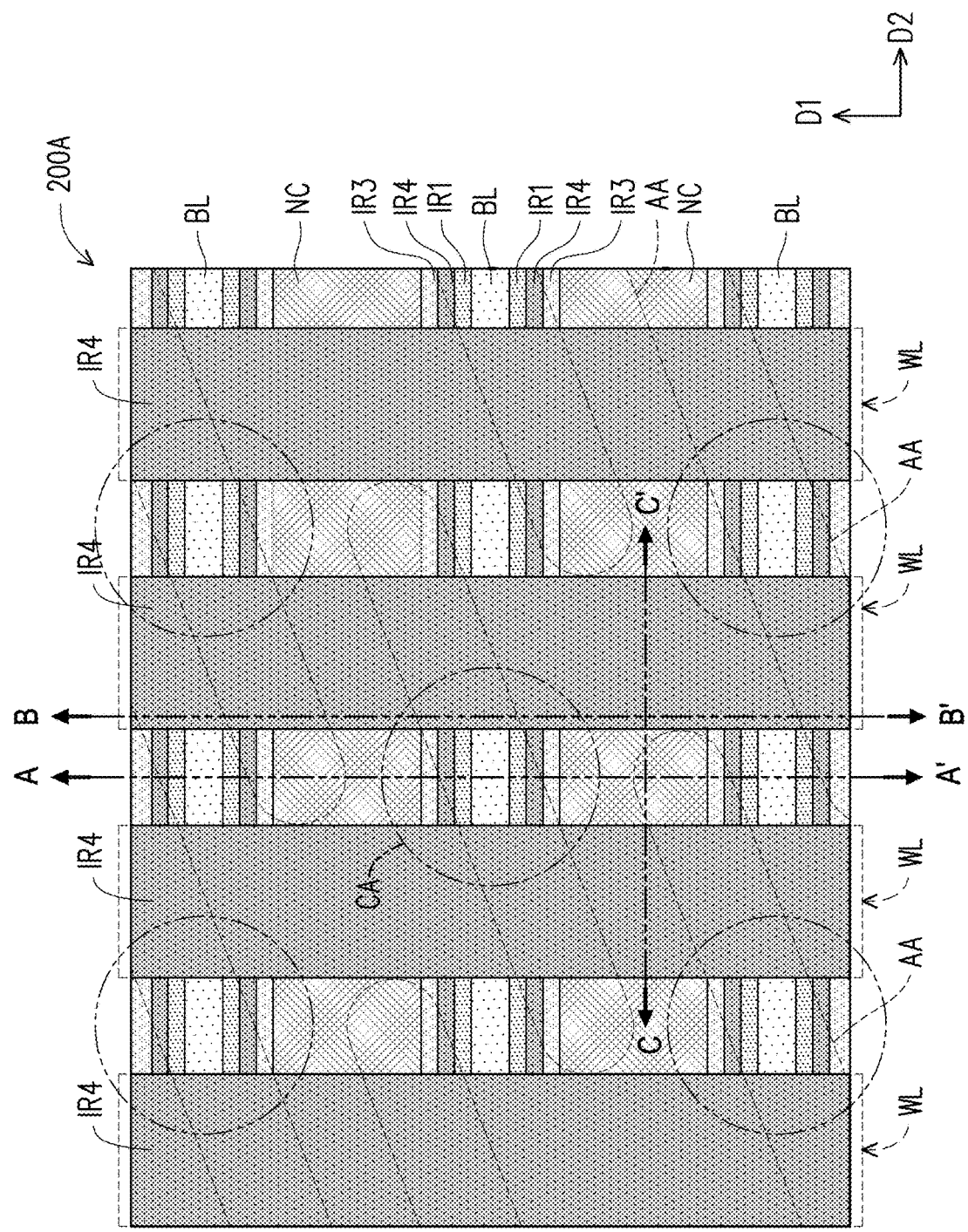
Figure 1I:
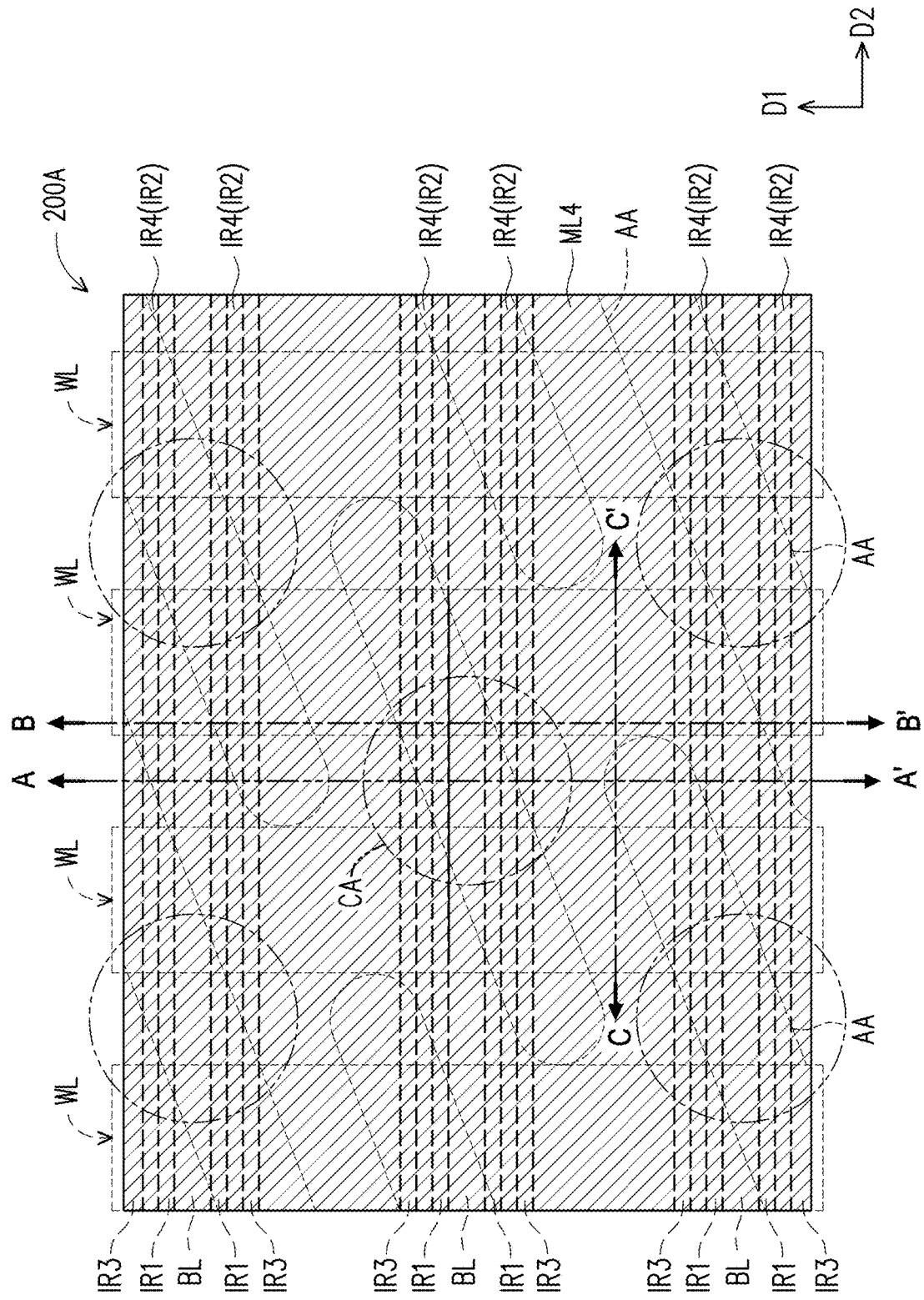
Figure 1J:
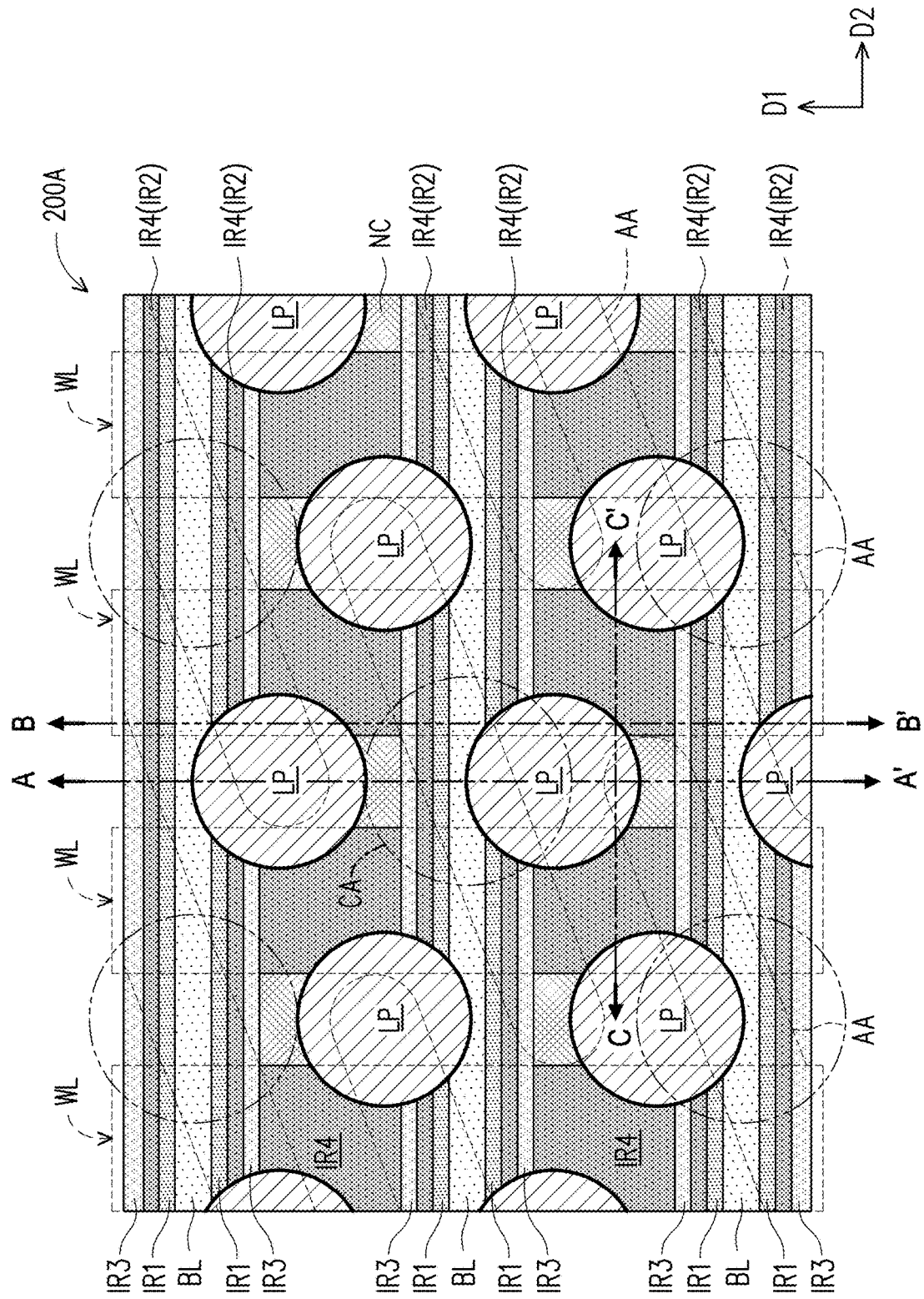

Referring to FIG. 1H, FIG. 2H, FIG. 3H, and FIG. 4H, next, a capacitor contact NC is formed in the capacitor contact hole SAC2. As shown in FIG. 1H, the capacitor contact NC is surround by the fourth dielectric layer IR4, and top surface of the capacitor contact is lower than the top surface of the second dielectric layer IR2. The capacitor contact NC may include a semiconductor layer PL2 and a metal layer ML3. The semiconductor layer PL2 may be a doped polysilicon layer. The metal layer ML3 may be a metal silicide, for example, cobalt silicide. The method for forming the capacitor contact NC includes, for example, filling the doped polysilicon material layer in the capacitor contact hole SAC2, and then etching back the doped polysilicon material layer to form the semiconductor layer PL2. Next, a self-aligned metal silicide process is performed to form a metal layer ML3 on the semiconductor layer PL2. Besides, the self-aligned metal silicide process may be performed after contact holes (not shown) in the peripheral region are formed.

Referring to FIG. 1I, FIG. 2I, FIG. 3J, and FIG. 4I, another conductive layer CL4 is formed above the substrate 100 to fill up the capacitor contact holes SAC2 which have the capacitor contacts NC formed inside and fill up the contact holes in the peripheral region. The conductive layer CL4 may include a barrier layer GL3 and a metal layer ML4. The material of the barrier layer GL3 is, for example, titanium, titanium nitride, tantalum, tantalum nitride, or a combination thereof. The material of the metal layer ML4 is, for example, tungsten.

Referring to FIG. 1J, FIG. 2J, FIG. 3J, and FIG. 4J, a lithography and etching process is performed to pattern the conductive layer CL4, thereby forming capacitor landing pads LP in the memory cell region R1, and forming contacts (not shown) in the peripheral region. Each capacitor landing pad LP is formed on and electrically connected to the capacitor contact NC. During the lithography and etching process, over etching may be performed to partially remove the first dielectric layer IR1, the third dielectric layer IR3 and the fourth dielectric layer IR4, so as to form a plurality of spacers SP2 with top surfaces at different heights on the sidewalls of the bit line stack patterns BL. Each spacer SP2 includes the first dielectric layer IR1, the second dielectric layer IR2, the third dielectric layer IR3 and the fourth dielectric layer IR4. Therefore, a part of each capacitor landing pad LP formed on the capacitor contact NC, and another part of each capacitor landing pad LP formed on the spacer SP2 and the bit line stack pattern BL.

By the present embodiment, since the spacer SP2 has a sufficient height, and there is a large etching selectivity for the spacer SP2 with respect to the capacitor landing pad LP, when patterning the conductive layer CL4 to form the capacitor landing pads LP, over-etching may be performed to ensure that the capacitor landing pads LP can be disconnected from each other, thereby avoiding occurrence of short circuit between the capacitor landing pads LP. And, the second dielectric layer IR2 of the spacer SP2 is still covered and protected by the fourth dielectric layer IR4 after the over-etching.

Besides, the over etching amount of the conductive layer CL4 for forming contacts in periphery area can be identical or similar to the over etching amount of the conductive layer CL4 for forming the capacitor landing pads LP. Therefore, the complexity of the process can be reduced.

Figure 1K:
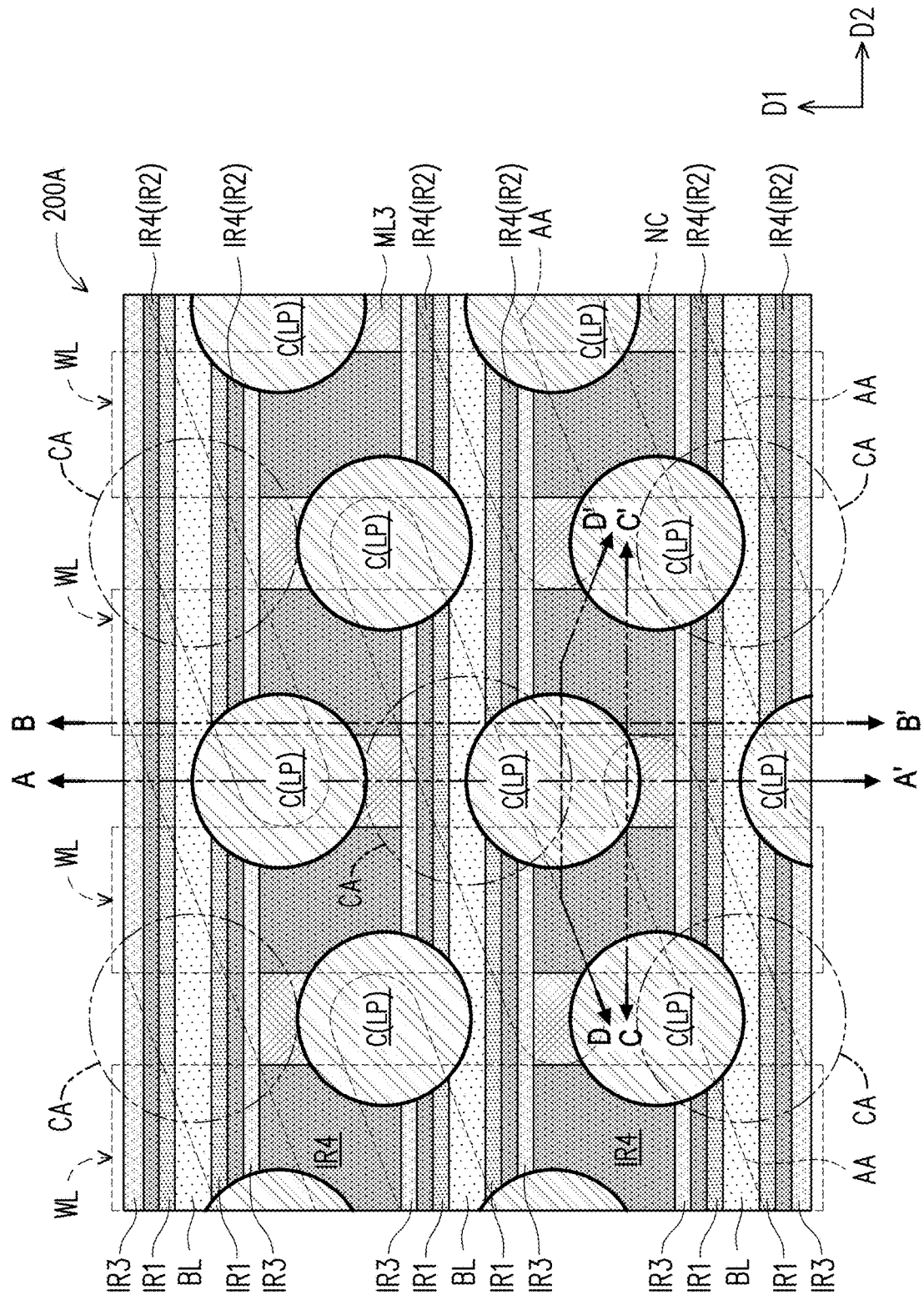
FIG. 1K is a top view of a DRAM according to the disclosure.
Figure 7A:
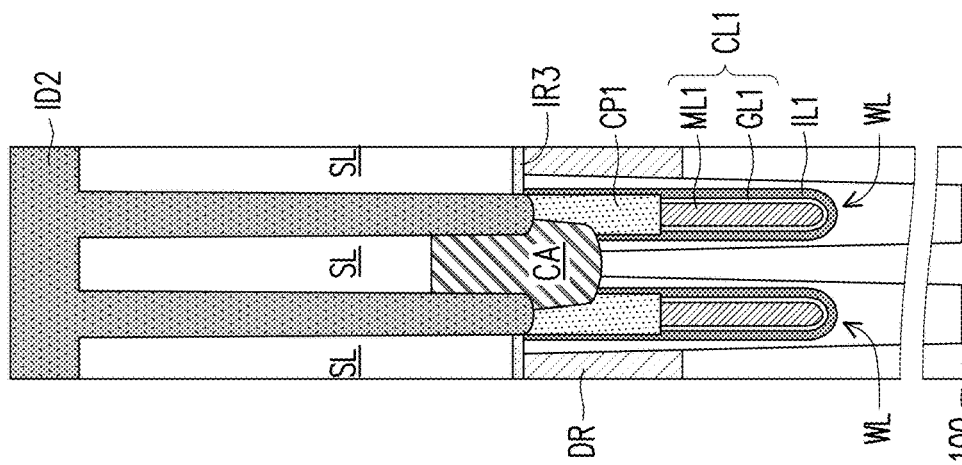
Figure 6A:
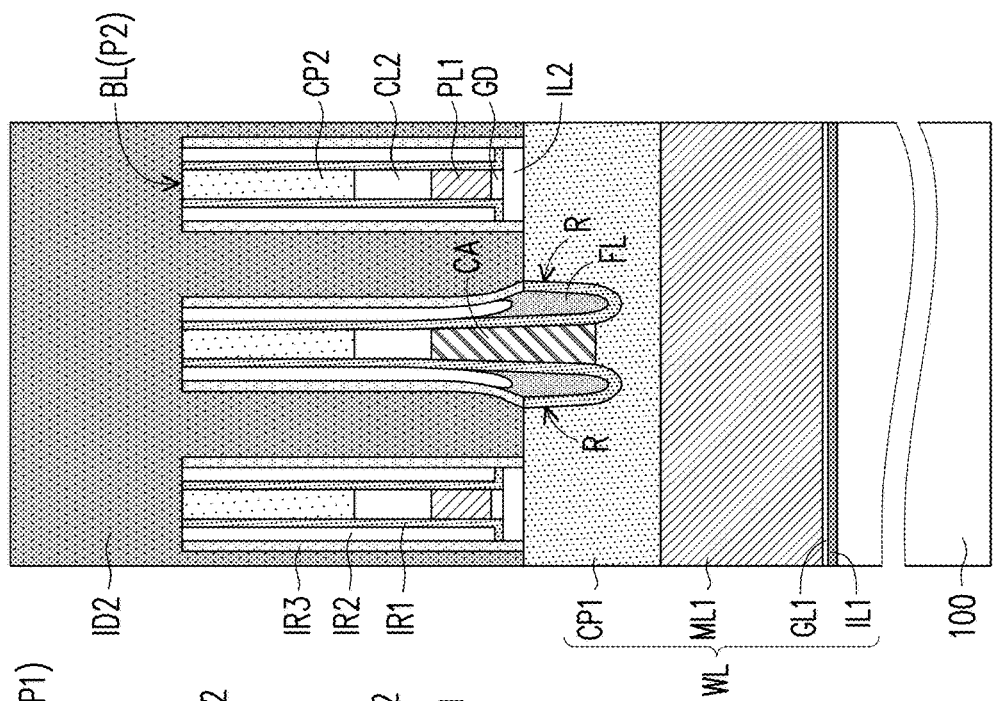
Figure 5A:
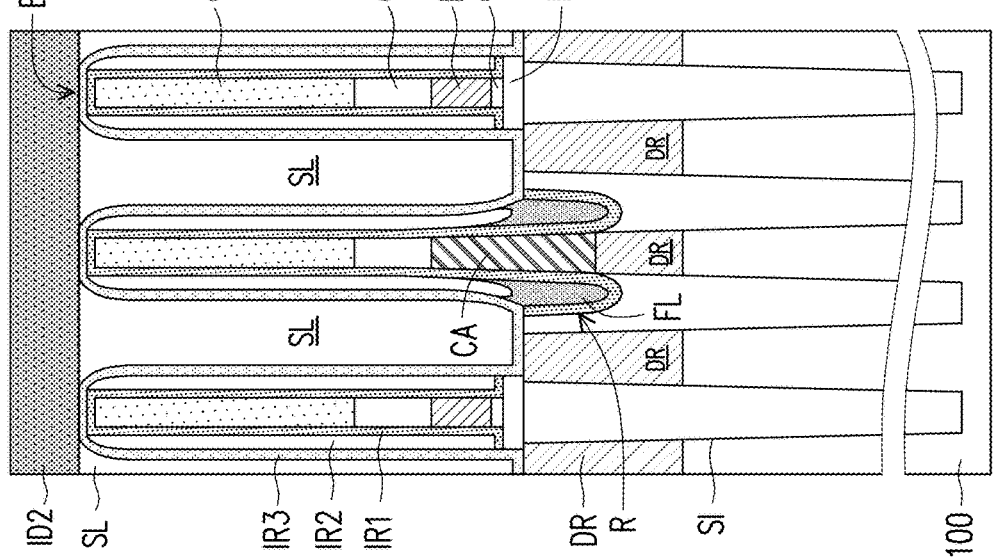
Figures 5C, 6C, 7C:
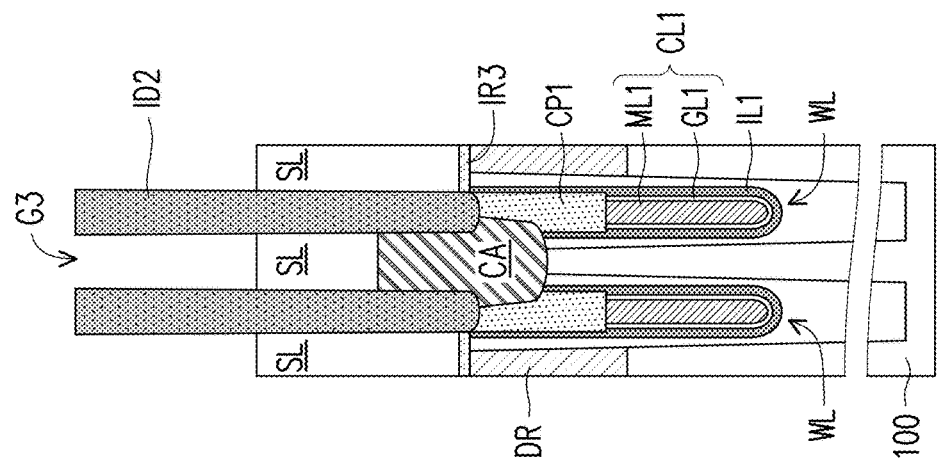

Referring to FIG. 1K, a capacitor C is formed on the capacitor landing pad LP. The capacitor C is electrically connected to the doped region DR in the substrate 100 through the capacitor landing pad LP and the capacitor contact NC.

In this embodiment, the spacer SP2 includes dielectric layers IR1, IR2, IR3 and IR4. The first dielectric layer IR1 has, for example, L-shaped section, and the dielectric layers IR2, IR3, and IR4 have, for example, I-shaped section. The first dielectric layer IR1 includes a horizontal portion E1 and a vertical portion E2. The second dielectric layer IR2 is located on the top surface of the horizontal portion E1 and on the lower sidewall of the vertical portion E2. The fourth dielectric layer IR4 is located between the upper sidewall of the vertical portion E2 of the first dielectric layer IR1 and the third dielectric layer IR3. The vertical length of the third dielectric layer IR3 is greater than the vertical lengths of the second dielectric layer IR2 and the fourth dielectric layer IR4. The bottom surface of the third dielectric layer IR3 is lower than the bottom surface of the second dielectric layer IR2. The third dielectric layer IR3 is located on the sidewalls of the insulating layer IL2, the horizontal portion E1 of the first dielectric layer IR1, the second dielectric layer IR2, and the fourth dielectric layer IR4.

In addition, in the embodiment, the spacer SP2 includes a first portion S1 and a second portion S2. The top surface and sidewall of the first portion S1 of the spacer SP2 are covered by the capacitor landing pad LP, and the second portion S2 of the spacer SP2 is not covered by the capacitor landing pad LP. The first portion S1 and the second portion S2 of the spacer SP2 respectively include the dielectric layers IR1, IR2, IR3 and IR4. The top surface of the second portion S2 of the spacer SP2 is lower than the top surface of the first portion S1 of the spacer SP2.

FIG. 5A to FIG. 5I, FIG. 6A to FIG. 7I and FIG. 8A to FIG. 8I are schematic cross-sectional views of a manufacturing method of a semiconductor device according to a second embodiment of the disclosure, which respectively correspond to sectional lines A-A', B-B' and D-D' of FIG. 1K. In this embodiment, the same or similar elements as those in the first embodiments use the same reference numerals, and the same or similar descriptions are omitted.

Referring to FIG. 5A to FIG. 7A, the second embodiment of the disclosure may be carried out with the steps corresponding to FIG. 1B to FIG. 3B according to the method described above in the first embodiment, and then, a dielectric layer ID2 is formed above the substrate 100 to fill in the reverse self-aligned contact holes SAC1 and formed on the sacrificial layer SL. The dielectric layer ID2 may include silicon nitride.

Referring to FIG. 5B to FIG. 7B, an etch-back process or a chemical mechanical polishing process is performed to remove part of the dielectric layer (or referred to as a fifth dielectric layer) ID2 to expose the sacrificial layer SL and the second dielectric layer IR2.

Referring to FIG. 5C to FIG. 7C, part of the second dielectric layer IR2 and the sacrificial layer SL are removed to form trenches G2 and G3. The trench G2 is defined by the dielectric layers IR1, IR2 and IR3. The trench G3 is formed on the remaining sacrificial layer SL. The bottom surfaces of the trenches G2 and G3 are between the top surface of the first dielectric layer IR1 and the top surface of the conductive layer CL2 of the bit line stack pattern BL.

Referring to FIG. 5D to FIG. 7D, a fourth dielectric layer IR4 is formed in the trenches G2 and G3. The surface of the trench G3 is conformally covered by the fourth dielectric layer IR4, and the trench G2 may be filled by the fourth dielectric layer IR4. The thickness of the fourth dielectric layer IR4 is smaller than the thickness of the dielectric layer ID2. The fourth dielectric layer IR4 may include a material same as the material of the dielectric layer ID2. For example, the fourth dielectric layer IR4 may include silicon nitride.

Referring to FIG. 5E to FIG. 7E, an anisotropic etching process is performed to remove the horizontal portion of the fourth dielectric layer IR4 to expose the top surfaces of the sacrificial layer SL, the dielectric layer ID2, the third dielectric layer IR3, the first dielectric layer IR1 and the cap layer CP2. Thereafter, the remaining fourth dielectric layer IR4 forms a cap layer CP3' in the trench G2, and a protrusion PP on the sidewall of the trench G3. Namely, in the project area between the buried word line structures WL (i.e. line A-A'), there are the first dielectric layer IR1, the cap layer CP3', the third dielectric layer IR3, the protrusion PP sequentially located on the upper sidewalls of bit line stack pattern BL. And, the protrusion PP is formed on the upper sidewalls of the dielectric layer ID2 formed on the buried word line structures WL. The first dielectric layer IR1, the second dielectric layer IR2, the third dielectric layer IR3, the protrusion PP, and the cap layer CP3' form the spacer SP2'.

Referring to FIG. 5F to FIG. 7F, a mask layer (not shown) covering the peripheral region and exposing the memory cell region is formed on the substrate 100. Next, a wet etching process to remove the sacrificial layer SL in the memory cell region is performed to expose lower sidewalls of the third dielectric layer IR3 where is not covered by the dielectric layer ID2. During the etching process, since the materials of the dielectric layer ID2, the cap layer CP2, and the dielectric layers IR1 and IR4 of the spacer SP2' are different from the material of the sacrificial layer SL, the sacrificial layer SL above the doped region DR on both sides of the buried word line structure WL is automatically aligned and removed, while preventing the bit line stack pattern BL from being damaged by etching. Moreover, after removing the sacrificial layer SL, the spacer SP2' still has a sufficient height.

Referring to FIG. 5G to FIG. 7G, an etching process such as an anisotropic etching process is performed on the horizontal portion of the third dielectric layer IR3 to form a plurality of capacitor contact holes SAC2 exposing the doped regions DR in the substrate 100. The vertical thicknesses of the cap layer CP2, the first dielectric layer IR1, the remaining fourth dielectric layer IR4 and the dielectric layer ID2 are thicker than that of the third dielectric layer IR3 which is horizontally formed on the substrate 100. Therefore, during etching the third dielectric layer IR3, the cap layer CP2, the first dielectric layer IR1, the remaining fourth dielectric layer IR4 and the dielectric layer ID2 can protect the underlying conductive layer CL2 and the second dielectric layer IR2 from being exposed. In order to ensure that the surface of the substrate 100 can be exposed, over-etching is performed, which causes that a part of the substrate 100 is also etched. In addition, part of the bit line contact CA is also removed.

Referring to FIG. 5H to FIG. 7H, FIG. 5I to FIG. 7I, and FIG. 1K, a capacitor contact NC, a capacitor landing pad LP, and a capacitor C are formed in the capacitor contact hole SAC2 according to the method described in the first embodiment. The capacitor landing pad LP overlaps a part of the capacitor contact NC, and overlaps a part of the spacer SP2' and a part of the cap layer CP2 of the bit line stack pattern BL, and extends downward to be electrically connected with the capacitor contact NC. In this embodiment, upper portion of the dielectric layer ID2 is removed. For example, when forming the capacitor landing pad LP, the upper portion of the dielectric layer ID2 is removed to expose the protrusion PP covering a middle sidewall of the capacitor landing pad LP. Therefore, the top surface of the dielectric layer ID2 disposed above the buried word line structure WL is lower than a top surface of the protrusion PP. For example, the top surface of the dielectric layer ID2 is not higher than the bottom surface of the protrusion PP. Accordingly, short circuit between the capacitor landing pads LP can be avoided.

Similarly, since the spacer SP2' still has a sufficient height, during the patterning process of the conductive layer CL4, the capacitor landing pad LP can be completely disconnected by over-etching, and therefore short circuit between the capacitor landing pads LP can be avoided.

In this embodiment, the spacer SP2' is similar to the spacer SP2 as described in the first embodiment, the same description will not be repeated. The difference is that the spacer SP2' further includes the protrusion PP made of the fourth dielectric layer IR4. The protrusion PP has, for example, I-shaped section. The cap layer CP3' is located between the upper sidewalls of the vertical portions of the first dielectric layer IR1 and the third dielectric layer IR3. The vertical length of the third dielectric layer IR3 is greater than the vertical length of the protrusion PP. The protrusion PP is located on the upper outer wall of the third dielectric layer IR3, and the upper portion of the third dielectric layer IR3 is sandwiched between the cap layer CP3' and the protrusion PP.

The spacer SP2' includes a first portion S1' and a second portion S2'. The top surface and sidewall of the first portion S1' of the spacer SP2' are covered by the capacitor landing pad LP, and the second portion S2' of the spacer SP2' is not covered by the capacitor landing pad LP. The first portion S1' of the spacer SP2' includes the dielectric layers IR1, IR2 and IR3, the cap layer CP3', and the protrusion PP, and their top surfaces are substantially coplanar. The protrusion PP of the first portion S1' of the spacer SP2' as well as the lower portion of the third dielectric layer IR3 are in contact with the capacitor landing pad LP. The second portion S2' of the spacer SP2' is similar to the second portion S2 of the spacer SP2, but the cap layer CP3' and the protrusion PP (the fourth dielectric layer IR4) are not included in the second portion S2' of the spacer SP2'. The top surface of the second portion S2' of the spacer SP2' is lower than the top surface of the first portion S1' of the spacer SP2'. Top surfaces of the first dielectric layer IR1, the second dielectric layer IR2 and the third dielectric layer IR3 of the second portion S2' of the spacer SP2' are exposed.

Besides, in the area between two adjacent bit line stack patterns BL and along the extending direction of the bit line stack pattern BL, the middle portion of the capacitor landing pad LP is protected by the protrusion PP.

In summary, in the embodiment of the disclosure, before the capacitor contact holes are formed, the upper portion of the intermediate layer (i.e. the second dielectric layer) in the spacer on the sidewall of the bit line stack pattern is replaced with the fourth dielectric layer with higher etching selectivity. Since there is a high etching selectivity for the fourth dielectric layer with respect to the sacrificial layer, the spacer still has a sufficient height before the patterning of the capacitor landing pad and after the formation of the capacitor contact holes. Therefore, over-etching may be performed while patterning the capacitor landing pads to ensure that the capacitor landing pads can be disconnected, thereby preventing short circuit from being occurred between the capacitor landing pads. In addition, the spacers on the sidewalls of the bit line stack patterns include a low dielectric constant material, so that the DRAM may have lower parasitic capacitance among the bit lines.

What is claimed is:

1. A DRAM, comprising:
    a plurality of buried word line structures in a substrate;
    a plurality of bit line stack patterns on the substrate; and
    a plurality of spacers, located on sidewalls of the plurality of bit line stack patterns, wherein each of the spacers comprises:
    a first dielectric layer, disposed on the sidewalls of the bit line stack pattern;
    a second dielectric layer, disposed on a sidewall of the first dielectric layer; and
    a third dielectric layer, disposed on a sidewall of the second dielectric layer, wherein a top surface of the second dielectric layer is lower than a top surface of the first dielectric layer and a top surface of the third dielectric layer; and
    a fourth dielectric layer, disposed on the top surface of the second dielectric layer,
    wherein the second dielectric layer and the fourth dielectric layer are disposed between the first dielectric layer and the third dielectric layer, and the second dielectric layer is made of a dielectric material of which a dielectric constant is lower than that of the first dielectric layer, the third dielectric layer, and the fourth dielectric layer;
    a plurality of capacitor contacts, electrically connected to active regions in the substrate, wherein top surfaces of the plurality of capacitor contacts are lower than the top surface of the second dielectric layer; and
    a plurality of capacitor landing pads, covering the plurality of capacitor contacts, first portions of the plurality of spacers, and a portion of the plurality of bit line stack patterns, wherein top surfaces of second portions of the plurality of spacers not covered by the plurality of capacitor landing pads are lower than top surfaces of the first portions of the plurality of spacers.

2. The DRAM of claim 1, wherein a top surface of the second dielectric layer is higher than a top surface of a plurality of conductive layers of the plurality of bit line stack patterns, and a bottom surface of the second dielectric layer is lower than a bottom surface of the plurality of conductive layers of the plurality of bit line stack patterns.

3. The DRAM of claim 2, wherein the first dielectric layer has L-shaped section, the second dielectric layer, the third dielectric layer and the fourth dielectric layer have I-shaped section.

4. The DRAM of claim 1, wherein in the first portions of the plurality of spacers, a top surface of the fourth dielectric layer, top surfaces of the first dielectric layer and the third dielectric layer are coplanar.

5. The DRAM of claim 1, wherein a bottom surface of the third dielectric layer is lower than a bottom surface of the second dielectric layer and lower than a bottom surface of the horizontal portion of the first dielectric layer.

6. The DRAM of claim 1, wherein the second dielectric layer comprises silicon oxide, and the first dielectric layer, the third dielectric layer, and the fourth dielectric layer comprises silicon nitride.

7. The DRAM of claim 1, wherein the first portion of each of the spacers further comprises a protrusion located on an upper outer wall of the third dielectric layer, such that an upper portion of the third dielectric layer is sandwiched between the fourth dielectric layer and the protrusion.

8. The DRAM of claim 7, wherein in the second portion of the plurality of spacers, a top surface of the second dielectric layer is exposed after the capacitor landing pads are formed, and the second portion of the plurality of spacers do not have the fourth dielectric layer and the protrusion.

9. The DRAM of claim 1, wherein in the second portion of the plurality of spacers, a top surface of the fourth dielectric layer is exposed after the capacitor landing pads are formed.

10. The DRAM of claim 7, wherein the plurality of capacitor landing pads are in contact with the protrusion and a lower portion of the third dielectric layer.

11. The DRAM of claim 7, further comprising a fifth dielectric layer disposed between the plurality of bit line stack patterns, such that a part of the third dielectric layer is disposed between the second dielectric layer and the fifth dielectric layer, wherein the fifth dielectric layer and the fourth dielectric layer are formed of the same material.

12. The DRAM of claim 7, further comprising a fifth dielectric layer disposed above the plurality of buried word line structures, wherein the protrusion covers a middle sidewall of each of the plurality of the capacitor landing pads, the top surface of the fifth dielectric layer is lower than a top surface of the protrusion, and the fifth dielectric layer and the fourth dielectric layer are formed of the same material.

13. A method of fabricating a DRAM, comprising:
  forming a plurality of buried word line structures in a substrate;
  forming a plurality of bit line stack patterns on the substrate;
  forming a plurality of spacers on sidewalls of the plurality of bit line stack patterns, wherein each of the spacers comprises:
    a first dielectric layer, disposed on the sidewalls of the bit line stack pattern;
    a second dielectric layer, disposed on a sidewall of the first dielectric layer;
    a third dielectric layer, disposed on a sidewall of the second dielectric layer, wherein a top surface of the second dielectric layer is lower than a top surface of the first dielectric layer and a top surface of the third dielectric layer; and
    a fourth dielectric layer, disposed on the top surface of the second dielectric layer, wherein the second dielectric layer and the fourth dielectric layer are disposed between the first dielectric layer and the third dielectric layer, and the second dielectric layer is made of a dielectric material of which a dielectric constant is lower than that of the first dielectric layer, the third dielectric layer, and the fourth dielectric layer;
  forming a plurality of capacitor contacts electrically connected to active regions in the substrate, wherein top surfaces of the plurality of capacitor contacts are lower than the top surface of the second dielectric layer; and
  forming a plurality of capacitor landing pads covering the plurality of capacitor contacts, first portions of the plurality of spacers, and a portion of the plurality of bit line stack patterns, wherein top surfaces of second portions of the plurality of spacers not covered by the plurality of capacitor landing pads are lower than top surfaces of the first portions of the plurality of spacers.

14. The method of claim 13, wherein forming the plurality of spacers comprises:
  forming the first dielectric layer on the plurality of bit line stack patterns;
  forming the second dielectric layer on the first dielectric layer;
  forming the third dielectric layer on the second dielectric layer and the substrate;
  forming a sacrificial layer on the third dielectric layer;
  forming a plurality of reverse self-aligned contact holes in the sacrificial layer over the plurality of buried word line structures;
  removing an upper portion of the second dielectric layer, such that a top surface of the second dielectric layer is lower than a top surface of the first dielectric layer and higher than a conductive layer of the bit line stack pattern;
  forming the fourth dielectric layer on the second dielectric layer, wherein the material of the fourth dielectric layer is different from the sacrificial layer; and
  removing the sacrificial layer and a bottom portion of the third dielectric layer to form the plurality of spacers, and to form a plurality of capacitor contact holes each between two adjacent ones of the spacers and exposing a corresponding one of the active regions,
  wherein the plurality of capacitor contacts is formed in the plurality of capacitor contact holes,
  wherein forming the plurality of capacitor landing pads comprises:
    forming a conductive material on the plurality of capacitor contacts and the plurality of spacers, and then patterning the conductive material to expose the top surfaces of the second portions of the plurality of spacers.

15. The method of claim 13, wherein the removing the upper portion of the second dielectric layer is performed to form a plurality of trenches each aside the bit line stack pattern and extending along a direction same as to an extending direction of the bit line stack pattern.

16. The method of claim 15, wherein forming the reverse self-aligned contact holes is followed by removing the upper portion of the second dielectric layer, such that a part of the plurality of trenches is enclosed by the remaining second dielectric layer and the third dielectric layer,
  wherein forming the fourth dielectric layer is performed after removing the upper portion of the second dielectric layer, and the fourth dielectric layer is formed in the plurality of trenches and the plurality of reverse self-aligned contact holes,
  wherein each of the plurality of capacitor contacts is surround by the fourth dielectric layer.

17. The method of claim 14, wherein forming the plurality of spacers further comprises:
  in the first portion of each of the spacers, forming a protrusion located on an upper outer wall of the third dielectric layer, such that an upper portion of the third dielectric layer is sandwiched between the fourth dielectric layer and the protrusion.

18. The method of claim 17, wherein before removing the sacrificial layer and the bottom portion of the third dielectric layer, the method further comprises:
  after forming the plurality of reverse self-aligned contact holes, forming a fifth dielectric layer to fill in the reverse self-aligned contact hole and formed on the sacrificial layer;
  partially removing the fifth dielectric layer to expose the second dielectric layer; and
  partially removing the sacrificial layer when removing the upper portion of the second dielectric layer to form a plurality of first trenches defining by the first dielectric layer, the remaining second dielectric layer, and the third dielectric layer, and form a plurality of second trenches on the remaining sacrificial layer,
  wherein the fourth dielectric layer is formed to conformally cover the surfaces of the plurality of the second trenches, and fill the plurality of first trenches.

19. The method of claim 18, further comprising:
  removing a horizontal part of the fourth dielectric layer to expose the sacrificial layer,
  wherein removing the sacrificial layer and the bottom portion of the third dielectric layer is performed after removing the horizontal part of the fourth dielectric layer.

20. The method of claim 17, wherein forming the plurality of capacitor landing pads further comprising:
  partially removing the fifth dielectric layer to expose the protrusion covering a middle sidewall of each of the plurality of the capacitor landing pads.

* * * * *